United States Patent [19]

Nakano et al.

[11] Patent Number: 5,117,388
[45] Date of Patent: May 26, 1992

[54] SERIAL INPUT/OUTPUT SEMICONDUCTOR MEMORY

[75] Inventors: Masao Nakano, Kawasaki; Satoru Kawamoto, Owariasahi; Akihiko Watanabe, Minokamo, all of Japan

[73] Assignees: Fujitsu Limited, Kanagawa; Fujitsu VLSI Limited, Aichi, both of Japan

[21] Appl. No.: 762,046

[22] Filed: Sep. 18, 1991

Related U.S. Application Data

[63] Continuation of Ser. No. 407,189, Sep. 14, 1989, abandoned.

[30] Foreign Application Priority Data

Sep. 20, 1988 [JP] Japan .............................. 63-235693
Sep. 20, 1988 [JP] Japan .............................. 63-235694

[51] Int. Cl.⁵ .................... G11C 7/00; G11C 8/04; G11C 11/407
[52] U.S. Cl. ........................... 365/73; 365/189.12; 365/221; 365/78
[58] Field of Search .................. 365/73, 78, 219, 221, 365/189.12, 230.05, 239, 240, 225.7

[56] References Cited

U.S. PATENT DOCUMENTS

| | | | |
|---|---|---|---|
| 3,141,153 | 7/1964 | Klein | 365/73 |
| 3,972,031 | 7/1976 | Riemenschneider et al. | 365/73 X |
| 4,101,973 | 7/1978 | Tromp | 365/73 |
| 4,128,879 | 12/1978 | Gardner | 365/73 |
| 4,313,159 | 1/1982 | Shoap | 365/73 X |
| 4,648,077 | 3/1987 | Pinkham et al. | 365/189.12 |
| 4,811,297 | 3/1989 | Ogawa | 365/189.12 X |
| 4,850,000 | 7/1989 | Dias | 365/219 X |
| 4,873,663 | 10/1989 | Baranyai et al. | 365/73 |

Primary Examiner—Alyssa H. Bowler
Attorney, Agent, or Firm—Armstrong, Nikaido, Marmelstein, Kubovcik and Murray

[57] ABSTRACT

A semiconductor memory comprises a memory cell array which includes a plurality of memory cells respectively connected to one of a plurality of word lines and to one of a plurality of bit lines, a serial data register which includes a number of bit cells corresponding to one word of the memory cell array, a decoder for decoding an address signal and for successively making an access to each bit cell of the serial data register based on a decoded result, a register group comprising $m+1$ shift registers in correspondence with each digit of the address signal, where each of the shift registers comprise n registers which are connected to form a loop and m and n are integers satisfying $m \geq 0$ and $n > 2$, a shift circuit for shifting a content of one of the shift registers corresponding to a least significant digit of the address signal in response to a clock signal, and a transfer circuit for transferring a carry information which is received from a first arbitrary one of the shift registers to a second arbitrary one of the shift registers. The first arbitrary shift register corresponds to an ith most significant digit of the address signal, the second arbitrary shift register corresponds to a $(i+1)$th most significant digit of the address signal, and output signals of the shift registers are used as the address signal.

20 Claims, 21 Drawing Sheets

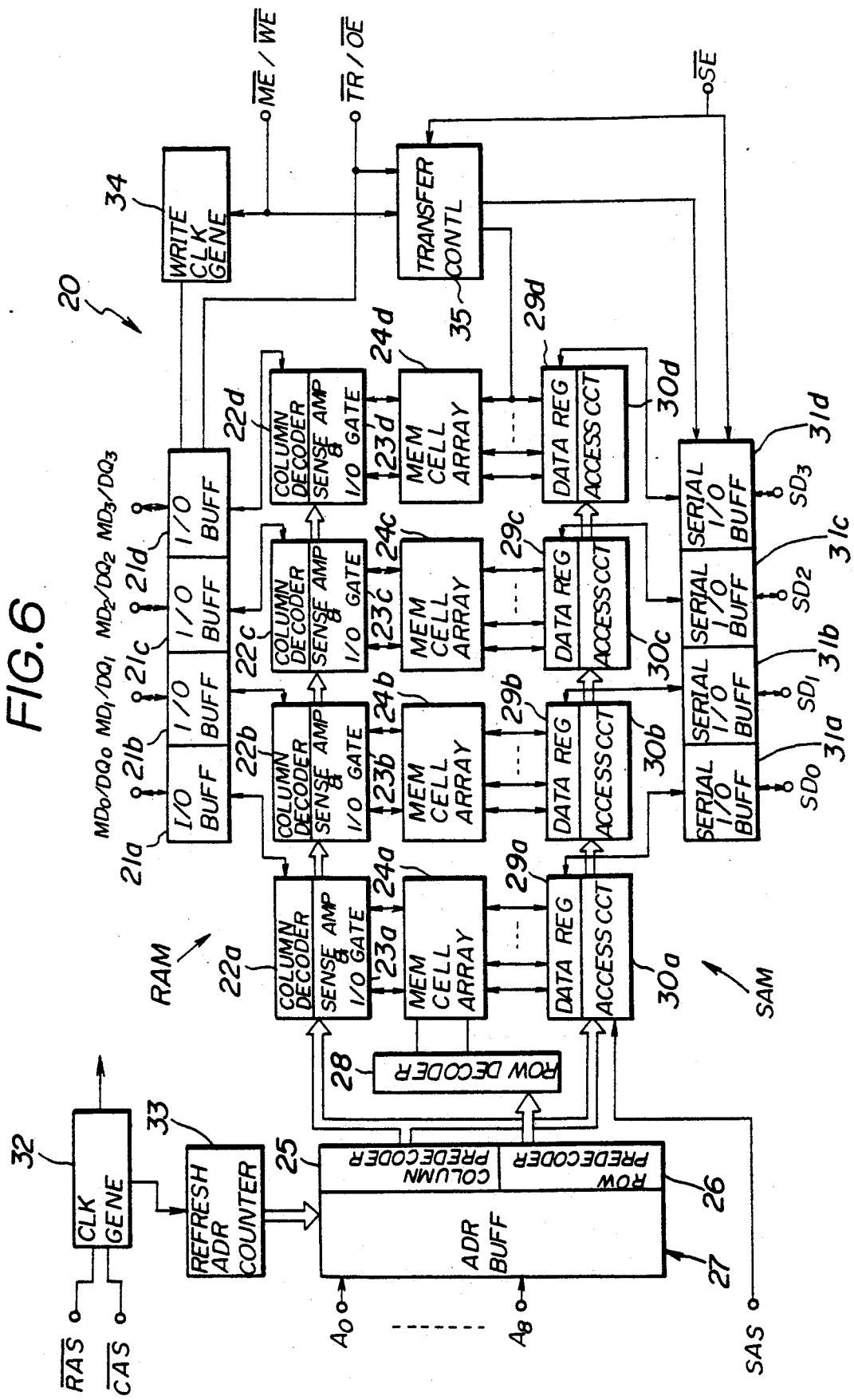

SERIAL INPUT/OUTPUT SEMICONDUCTOR MEMORY

This is a continuation of application Ser. No. 407,189, filed Sept. 14, 1989, now abandoned.

BACKGROUND OF THE INVENTION

The present invention generally relates to semiconductor memories, and more particularly to a semiconductor memory which has a reduced chip area required for an access circuit and is capable of operating at an improved operation speed.

Generally, in a semiconductor memory which is used in the field of image processing, there is a demand to enable both a random data access from a central processing unit (CPU) and a serial data access from a cathode ray tube (CRT). Hence, a so-called dual port memory which has a random access port and a serial access port is used in the field of image processing.

A conventional dual port memory comprises a random access memory (RAM) and a serial access memory (SAM) which is provided with a data register for holding a datum amounting to one word of the RAM. By making successive access to each cell of the data register, it is possible to make an access to the RAM via the SAM.

There are two methods of making access to the data register as will be described hereunder.

In FIG. 1, a decoder 1 decodes an address signal and sets "1" to one of registers constituting a pointer 2. The "1" set in the pointer 2 is successively shifted responsive to a clock signal received from a clock generator 3. The clock generator 3 generates the clock signal based on an external clock signal. Each register of the pointer 2 makes a pair with a corresponding memory cell of a serial access memory 4, and thus, an access is made to a memory cell of the serial access memory 4 corresponding to the position of "1" set in the pointer 2. A datum is read out from or written into the memory cell of the serial access memory 4 to which the access is made.

On the other hand, in FIG. 2, an address counter 5 generates a binary address signal and a predecoder 6 generates an internal address signal by converting the binary address signal into an octal address signal, for example. A decoder 7 decodes the internal address and makes access to a memory cell of a serial access memory 8. In other words, it is possible to successively make serial access to the memory cells of the serial access memory 8 by repeating a counting operation of the address counter 5 in response to the clock signal.

However, according to the first conventional method described in conjunction with in FIG. 1, it is necessary to provide the pointer 2 which comprises a number of registers equal to the number of memory cells of the serial access memory 4. For example, in a case where the RAM comprises an array of 512×512 memory cells, there are 512 memory cells in the serial access memory 4 and it is consequently necessary to provide 512 registers in the pointer 2. As a result, there is a problem in that the pointer 2 occupies a large area within the chip.

On the other hand, according to the second conventional method described in conjunction with in FIG. 2, the problem of the pointer occupying a large area within the chip is eliminated because no pointer is used. But the following circuit operation is required to make access to the serial access memory 8. That is, (i) the clock signal must be generated by the clock generator 3 responsive to the external clock signal, (ii) the address counter 5 must be operated in response to the clock signal, (iii) the binary address signal (binary datum) from the address counter 5 must be subjected to a data conversion in the predecoder 6, and (iv) the internal address signal from the predecoder 6 must be decoded in the decoder 7. As a result, it is difficult to increase the operation speed of the memory. The operating time of the predecoder 6 in particular is relatively long and greatly affects the operation speed of the entire memory.

SUMMARY OF THE INVENTION

Accordingly, it is a general object of the present invention to provide a novel and useful semiconductor memory in which the problems described above are eliminated.

Another and more specific object of the present invention is to provide a semiconductor memory comprising a memory cell array which includes a plurality of memory cells respectively connected to one of a plurality of word lines and to one of a plurality of bit lines, a serial data register which includes a number of bit cells corresponding to one word of the memory cell array, decoder means for decoding an address signal and for successively making an access to each bit cell of the serial data register based on a decoded result, a register group comprising m+1 shift registers in correspondence with each digit of the address signal, where each of the shift registers comprise n registers which are connected to form a loop and m and n are integers satisfying $m \geq 0$ and $n > 2$, shift means for shifting a content of one of the shift registers corresponding to a least significant digit of the address signal in response to a clock signal, and transfer means for transferring a carry information which is received from a first arbitrary one of the shift registers to a second arbitrary one of the shift registers, where the first arbitrary shift register corresponds to an with most significant digit of the address signal and the second arbitrary shift register corresponds to a (i+1) the most significant digit of the address signal. Output signals of the shift registers are used as the address signal. According to the semiconductor memory of the present invention, it is possible to reduce the area the access circuit occupies within the chip of the semiconductor memory and also improve the operation speed of the semiconductor memory.

Still another object of the present invention is to provide a semiconductor memory of the above described type which further comprises redundant address generating means for generating a redundant address signal and a redundancy discriminating circuit for supplying to the first decoder means a redundancy switch signal for activating a redundant memory cell within the memory cell array when the address signal coincides with the redundant address signal. The redundant address generating means includes redundant fuses which are selectively melted and cut depending on the redundant address signal which is to be generated, and the redundant fuses are grouped for each output signal of the register group. According to the semiconductor memory of the present invention, it is possible to considerably reduce the number of redundant fuses which needs to be melted and cut when determining the redundant address signal. Hence, it is possible to improve the programming efficiency when programming the redundant address and also improve the operation stability of the semiconductor memory.

Other objects and further features of the present invention will be apparent from the following detailed description when read in conjunction with the accompanying drawings.

BRIEF DESCRIPTION OF THE DRAWINGS

FIG. 6 is a system block diagram showing an essential part of a first embodiment of the semiconductor memory according to the present invention;

DESCRIPTION OF THE PREFERRED EMBODIMENTS

Figure 3:
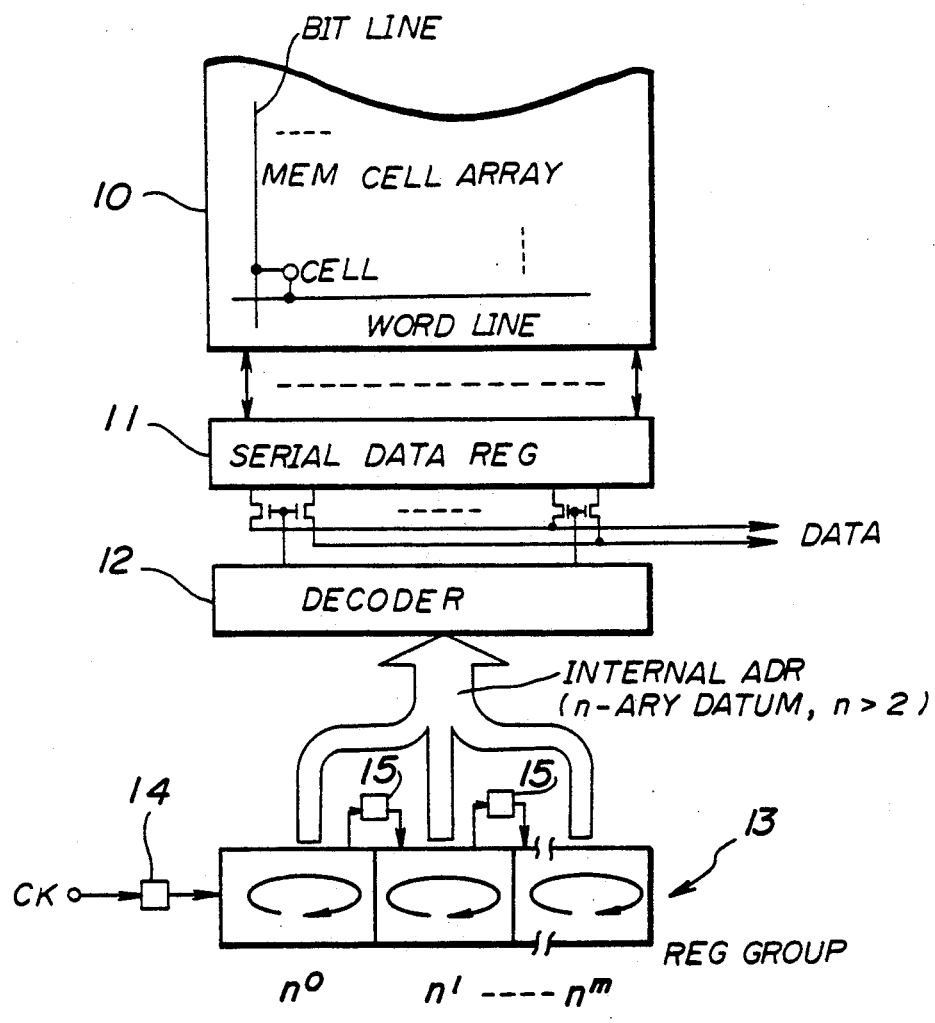
FIG. 3 is a system block diagram showing an essential part of a semiconductor memory according to the present invention for explaining an operating principle thereof.

First, a description will be given of an operating principle of a semiconductor memory according to the present invention, by referring to FIG. 3. A semiconductor memory shown in FIG. 3 generally comprises a memory cell array 10 of a RAM, a serial data register 11 which comprises a number of bit cells corresponding to one word of the memory cell array 10, a decoder 12, a register group 13, a shift means 14, and a transfer means 15.

The decoder 12 decodes an n-ary address signal (hereinafter referred to as an internal address signal) and makes an access to each bit cell of the serial data register 11, where n is an integer greater than two. For example, n is selected to eight for the sake of convenience. The register group 13 comprises a plurality of shift registers $n^0, n^1, \ldots, n^m$, and each shift register $n^i$ has n registers (not shown) which are coupled to form a loop, where $i = 0, 1, \ldots, m$. The shift means 14 shifts a content of the shift register $n^0$ which corresponds to a least significant digit in response to a predetermined clock signal CK. The transfer means 15 transfers a carry signal from a shift register $n^j$ which corresponds to a lower significant digit to a shift register $n^{j+1}$ which corresponds to a higher significant digit, where $j = 0, 1, \ldots, m-1$.

Figure 4:
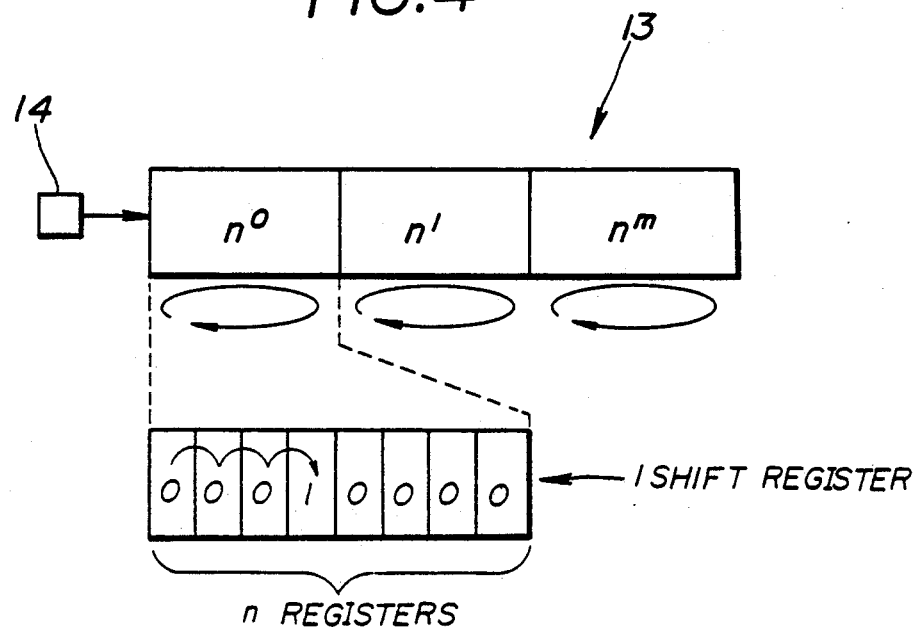
FIG. 4 is a system block diagram showing a register group shown in FIG. 3.
Figure 5A:
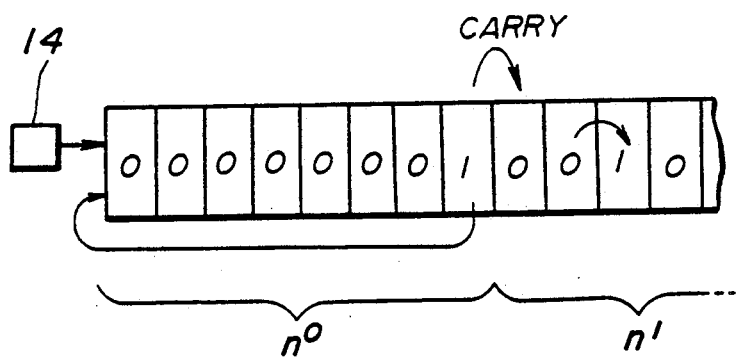
FIGS. 5A and 5B are system block diagrams showing an essential part of the register group shown in FIG. 4.

The shift means 14 shifts the content of the shift register $n^0$ as shown in FIG. 4 every time the clock signal CK is received. When a carry signal is generated from the shift register $n^0$, the content of the shift register $n^1$ is shifted by one bit as shown in FIG. 5A. When a carry signal is generated from the shift register $n^1$, the content of the shift register $n^2$ which corresponds to the next higher significant digit is similarly shifted by one bit. The contents of the shift registers which correspond to the higher significant digits are successively shifted in a similar manner and the content of the shift register $n^m$ which corresponds to the most significant digit is finally shifted. In other words, when the shift register $n^0$ counts from "0" to "7" and the count returns to "0", the count in the shift register $n^1$ becomes "1" and the carry signal is generated from this shift register $n^1$ when such an operation is repeated eight times. Accordingly, a 3-digit octal datum is output from the register group 13 and is supplied to the decoder 12 as the internal address signal.

Figure 1:
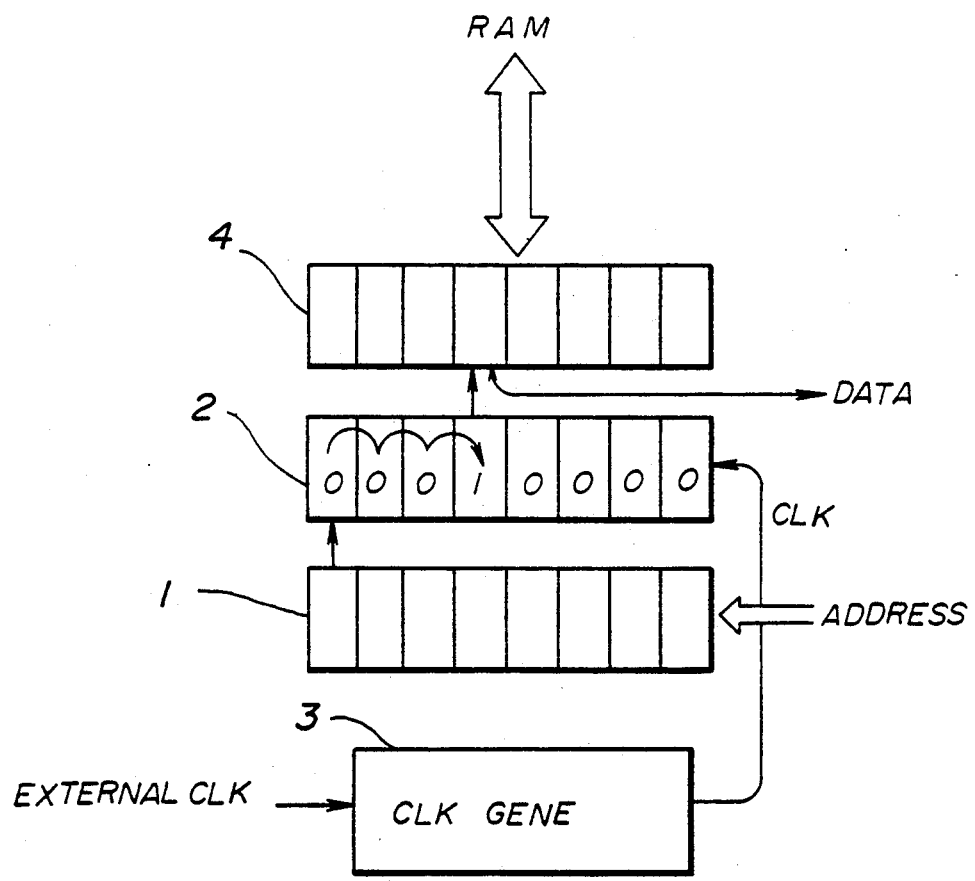
FIG. 1 is a system block diagram showing an essential part of an example of a conventional semiconductor memory.

As a result, when n is equal to eight and the internal address signal has three digits, a number of registers which make up the register group 13 is twenty-four ($8 \times 3 = 24$). Hence, when the present invention is applied to a serial access memory which comprises a RAM with an array of $512 \times 512$ memory cells, it is possible to considerably reduce the number of registers compared to 512 registers required in the first conventional method described before in conjunction with FIG. 1. Therefore, it is possible to considerably reduce the area the registers occupy within the chip.

Figure 2:
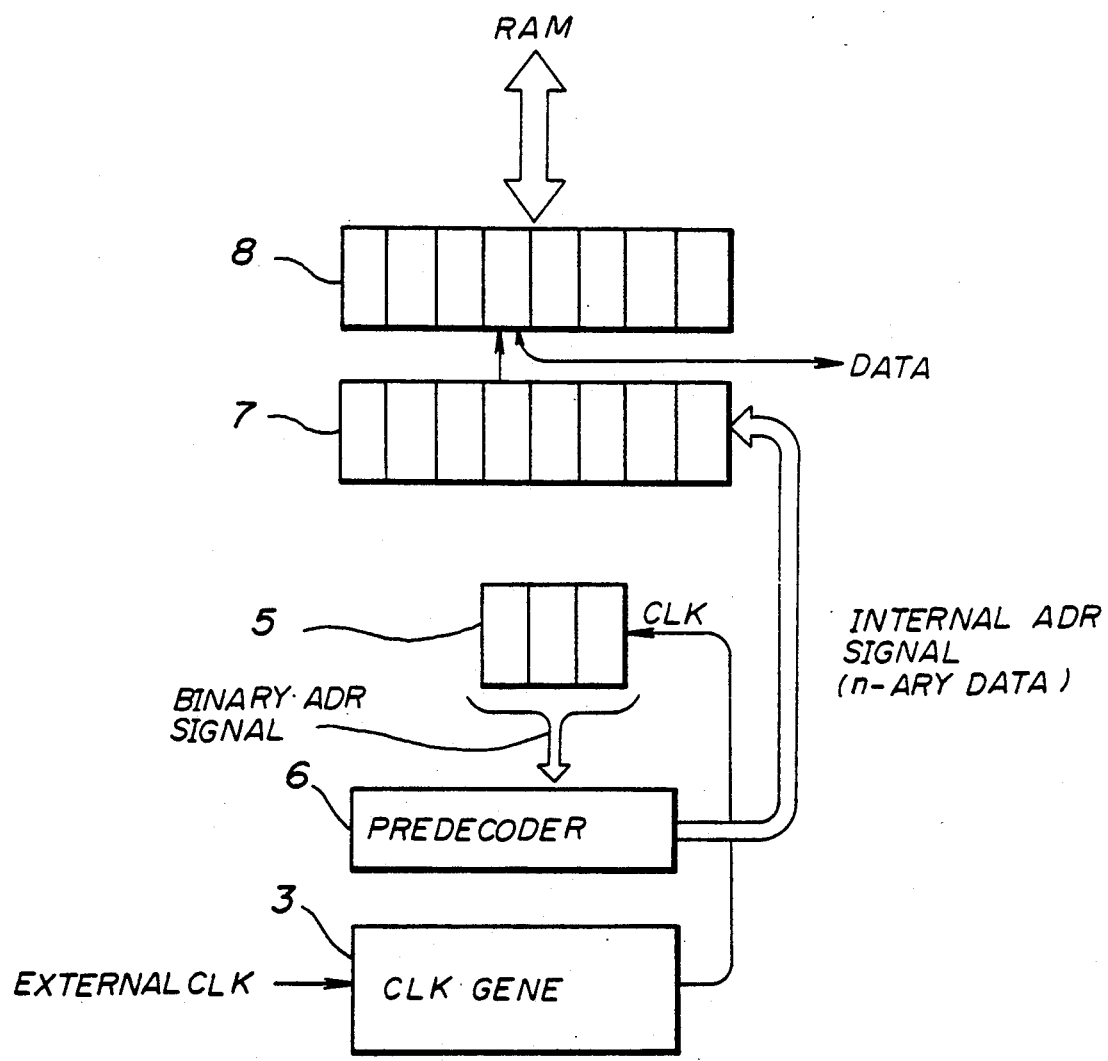
FIG. 2 is a system block diagram showing an essential part of another example of the conventional semiconductor memory.

In addition, compared to the second conventional method described before in conjunction with FIG. 2, it is unnecessary to provide a predecoder. For this reason, it is possible to increase the operation speed by an amount which corresponds to the operating time of the predecoder.

Figure 5B:
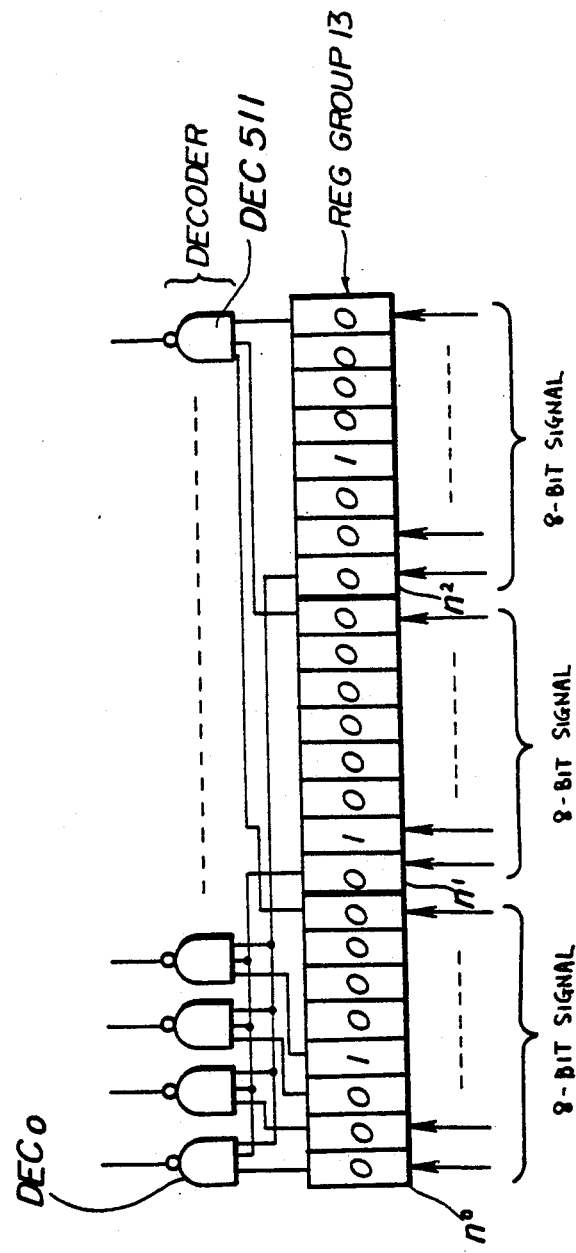

FIG. 5B shows an essential part of the register group for a case where the serial data register 11 has 512 bits and the decoder 12 comprises NAND gates DEC0 through DEC511. In order to make access to a bit located at an arbitrary position of the serial data register 11, it is necessary to set an initial value in the shift register group 13. In the above described case, a 3-digit octal code is set in the shift register group 13. This 3-digit octal code is obtained by predecoding an external binary address. For example, an 8-bit signal is obtained by predecoding a 3-bit binary address AO through A2 and this 8-bit signal is supplied to the shift register $n^0$. An 8-bit signal is obtained by predecoding a 3-bit binary address A3 through A5 and this 8-bit signal is supplied to the shift register $n^1$. An 8-bit signal is obtained by predecoding a 3-bit binary address A6 through A8 and this 8-bit signal is supplied to the shift register $n^2$.

Next, a description will be given of a first embodiment of the semiconductor memory according to the present invention, by referring to FIGS. 6 through 17. In this embodiment, the present invention is applied to a dual port memory having 512×4 bits.

In FIG. 6, a dual port memory 20 comprises a RAM and a SAM. The RAM comprises four sets of input/output buffers 21a through 21d, column decoders 22a through 22d, sense amplifier and input/output gates 23a through 23d, and memory cell arrays 24a through 24d. The RAM additionally comprises an address buffer 27 which includes a column predecoder 25 and a row predecoder 26, and a row decoder 28. On the other hand, the SAM comprises four sets of serial data registers 29a through 29d, serial access circuits 30a through 30d, and serial input/output buffers 31a through 31d. The SAM additionally comprises a clock generator 32, a refresh address counter 33, a write clock generator 34, and a transfer controller 35.

In FIG. 6, $\overline{RAS}$ denotes a row address strobe signal, $\overline{CAS}$ denotes a column address strobe signal, $\overline{ME/WE}$ denotes a mask mode enable/write enable signal, $\overline{TR/OE}$ denotes a transfer enable/output enable signal, $\overline{SE}$ denotes a serial port enable signal, SAS denotes a serial access strobe signal, $MD_0/DQ_0$ through $MD_3/DQ_3$ denote mask data or random input/output data, $SD_0$ through $SD_3$ denote serial input/output data, and $A_0$ through $A_3$ denote external address signals.

Figure 7:
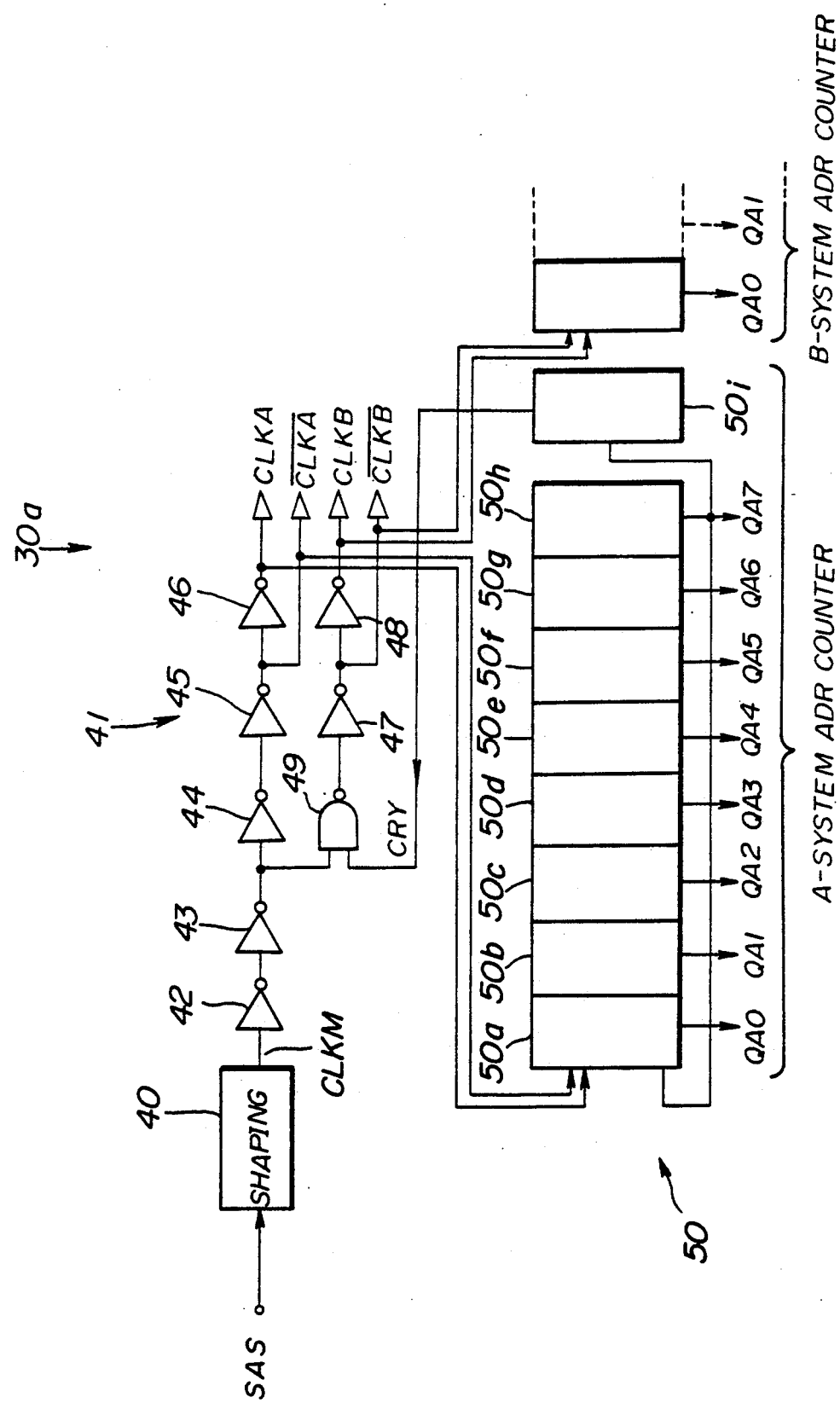
FIG. 7 is a system block diagram showing an embodiment of a serial access circuit shown in FIG. 6.

The serial access circuit 30a through 30d constitute an essential part of this embodiment. FIG. 7 shows an embodiment of an essential part of the serial access circuit 30a which has a construction identical to those of the other serial access circuits 30b, 30c and 30d. For the sake of convenience, it is assumed hereunder that n is equal to eight and the internal address is described by a 3-digit octal number having digits $n^0$, $n^1$ and $n^2$. Further, it is assumed that the digit $n^0$ ($8^0$) is processed by an A-system, the digit $n^1$ ($8^1$) is processed by a B-system, and the digit $n^2$ ($8^2$) is processed by a C-system.

The SAS signal is subjected to a wave-shaping in a shaping circuit 40 and is supplied to a timing circuit 41 as a master clock signal CLKM. The timing circuit 41 has the functions of the shift means 14 and the transfer means 15. The timing circuit 40 comprises seven inverters 42 through 48 and a NAND gate 49. The timing circuit 40 generates a clock signal CLKA which has the same period as the master clock signal CLKM and an inverted signal $\overline{CLKA}$ of the clock signal CLKA. When a carry signal CRY is applied to the timing circuit 40, a clock signal CLKB and an inverted signal $\overline{CLKB}$ thereof are generated with a timing determined by the carry signal CRY.

A shift register 50 is one of a plurality of shift registers which are provided in correspondence with each of the digits of the n-ary internal address signal. The shift register 50 comprises n (n=8 in this case) counters 50a through 50h and a carry generating circuit 50i. The shift register 50 shown in FIG. 7 constitutes the address counter of the A-system (that is, the address counter for the digit $n^0$).

Figure 8:
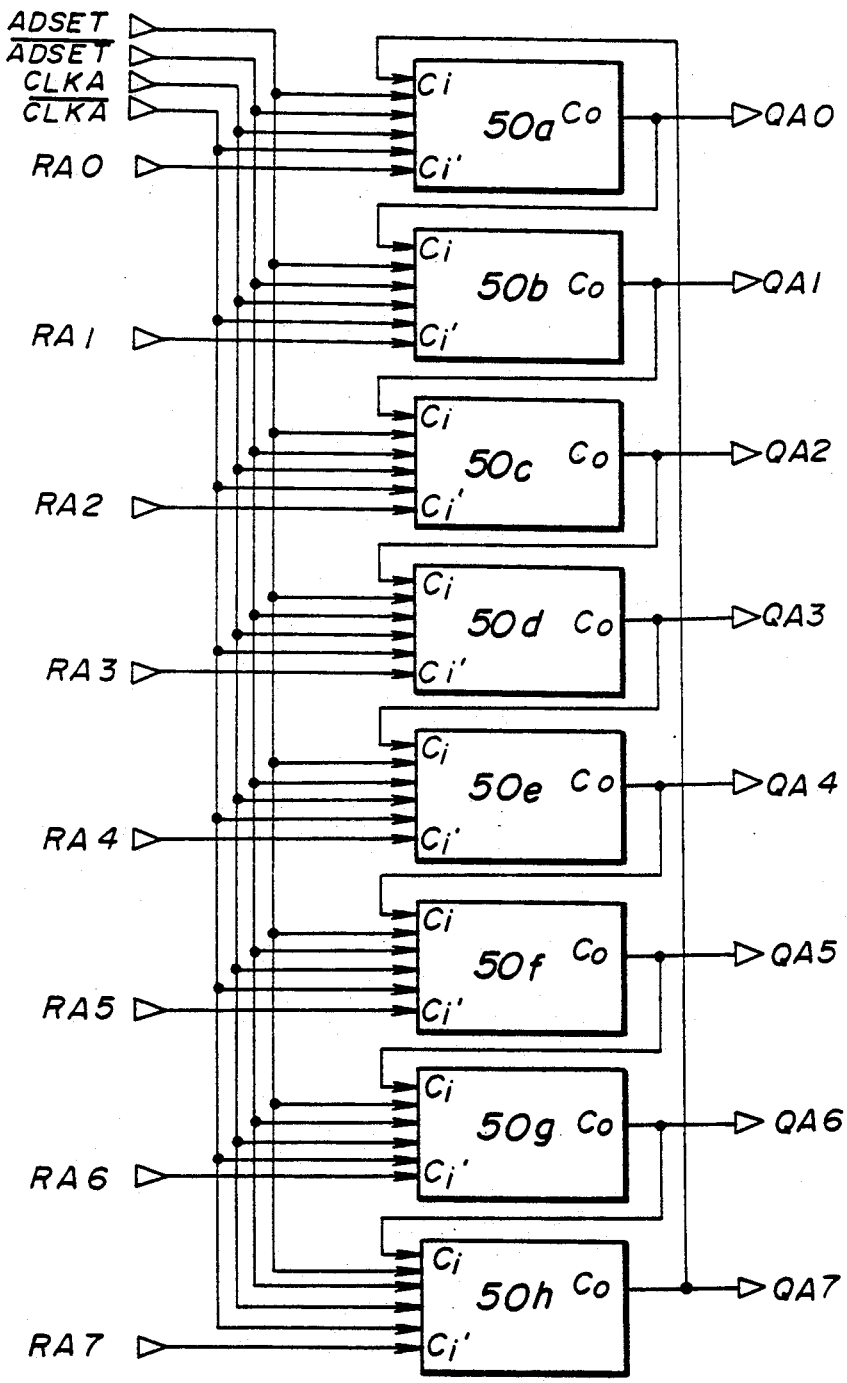
FIG. 8 is a system block diagram showing an embodiment of an essential part of a shift register shown in FIG. 7.

FIG. 8 shows an embodiment of an essential part of the A-system shift register 50 shown in FIG. 7. The counters 50a through 50h are coupled to form a loop. In other words, a counter output Co of each counter is coupled to a counter input Ci of a counter in a next stage. The counter output Co of the counter 50a is coupled to the counter input Ci of the counter 50b, the counter output Co of the counter 50b is coupled to the counter input Ci of the counter 50c, . . ., the counter output Co of the counter 50g is coupled to the counter input Ci of the counter 50h, and the counter output Co of the counter 50h is coupled to the counter input Ci of the counter 50a. Data QA0 through QA7 obtained from the counter outputs Co of the counters 50a through 50h correspond to the digit $n^0$ (that is, $8^0$) of the octal internal address. The data QA0 through QA7 are supplied to a decoder (not shown) which is included within the access circuits 30a through 30d together with the data which are output from the B-system and C-system shift registers 50 and respectively correspond to the digits $n^1$ and $n^2$ (that is, $8^1$ and $8^2$), and used to make access to the serial data registers 29a through 29d. Data RA0 through RA7 applied to counter inputs Ci, of the counters 50a through 50h are the octal column address signal received from the column predecoder 25, and this octal address signal is used as an initial address for the counters 50a through 50h. ADSET and $\overline{ADSET}$ respectively denote initial address set signals, and the data RA0 through RA7 are set within the corresponding counters 50a through 50h when the initial address set signal ADSET has a high level and the initial address set signal $\overline{ADSET}$ has a low level.

Figure 9:
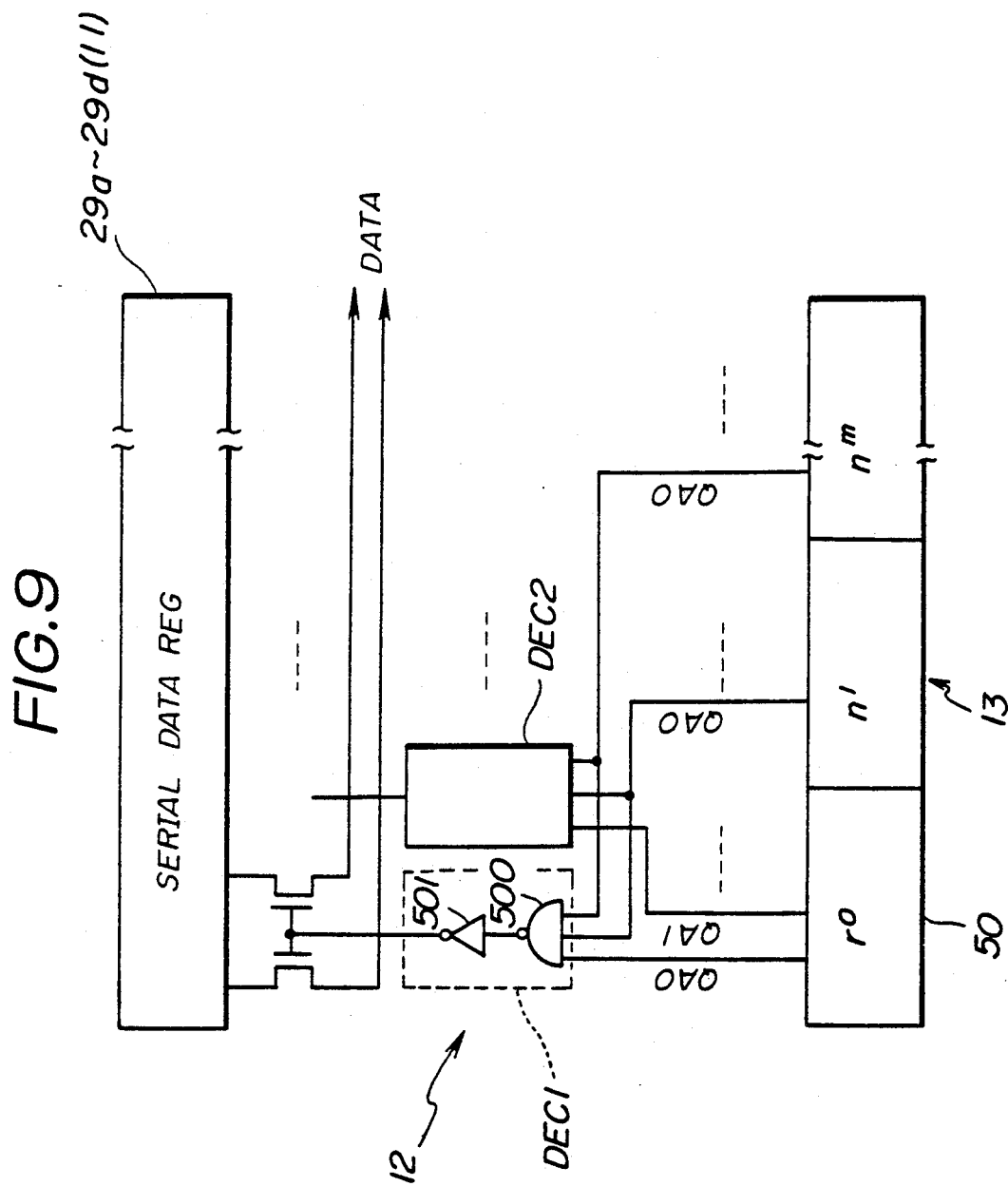
FIG. 9 is a system block diagram showing an essential part of a decoder and its related parts.

FIG. 9 shows an essential part of the above mentioned decoder and its related parts. The decoder 12 is included within the access circuits 30a through 30d and comprises decoder portions DEC1, DEC2 and the like. The decoder portions DEC1, DEC2 and the like respectively comprise a NAND gate 500 which receives predetermined outputs of the register group 13 and an inverter 501 for inverting an output of the NAND gate 500. Each decoder portion receives an output from each of the A-system, B-system and C-system shift registers 50 in the register group 13. For example, the decoder portion DEC1 receives the datum QA0 output from each of the A-system, B-system and C-system shift registers 50.

Figure 10:
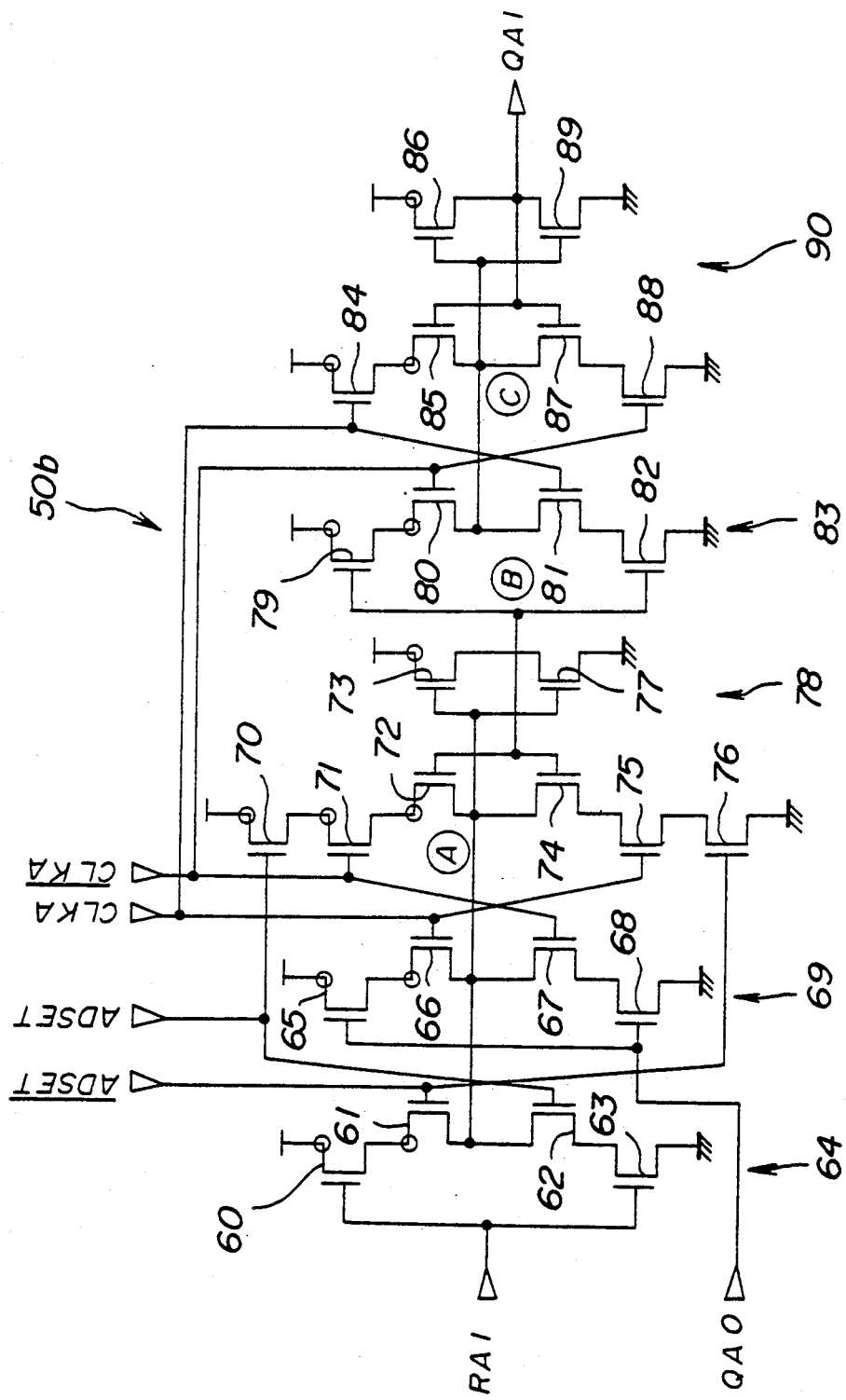
FIG. 10 is a circuit diagram showing an embodiment of a counter shown in FIG. 8.

FIG. 10 shows an embodiment of the counter 50b which has a construction identical to those of the other counters 50a and 50c through 50h. The counter 50b comprises a first gate 64 which includes two p-channel transistors 60 and 61 and two n-channel transistors 62 and 63 having a totem pole connection, a second gate 69 which includes two p-channel transistors 65 and 66 and two n-channel transistors 67 and 68 having a totem pole connection, and a slave side flip-flop 78 which includes four p-channel transistors 70 through 73 and four n-channel transistors 74 through 77. The first gate 64 enters the datum RA1 of the column address signal when the initial address set signal $\overline{ADSET}$ has a low level and the initial address set signal ADSET has a high level, and the slave side flip-flop 78 latches the entered datum RAI when the clock signal $\overline{CLKA}$ changes from a high level to a low level (that is, the clock signal CLKA changes from a low level to a high level). The counter 50b further comprises a third gate 83 which includes two p-channel transistors 79 and 80 and two n-channel transistors 81 and 82 having a totem pole connection, and a master side flip-flop 90 which includes three p-channel transistors 84 through 86 and three n-channel transistors 87 through 89. When the clock signal CLKA changes from the low level to the high level (that is, the clock signal $\overline{CLKA}$ changes from the high level to the low level), the third gate 83 and the master side flip-flop 90 latches the datum RAI received from the slave side flip-flop 78 and outputs the latched datum RA1 as the datum QA1.

Figure 11:
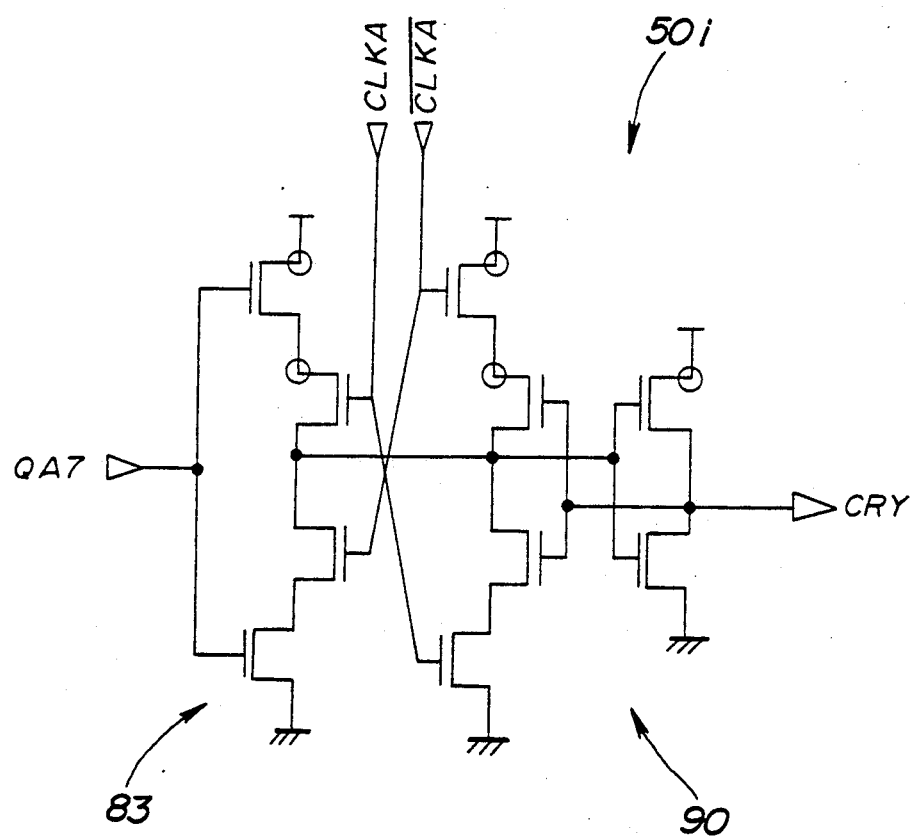
FIG. 11 is a circuit diagram showing an embodiment of a carry generating circuit shown in FIG. 7.

FIG. 11 shows an embodiment of the carry generating circuit 50i shown in FIG. 7. The carry generating circuit 50i comprises the third gate 83 and the master side flip-flop 90 which are the same as those of the counter 50b shown in FIG. 10. The carry generating circuit 50i delays the datum QA7 received from the counter 50h by one clock and outputs the delayed datum QA7 as the carry signal CRY.

Figure 12:
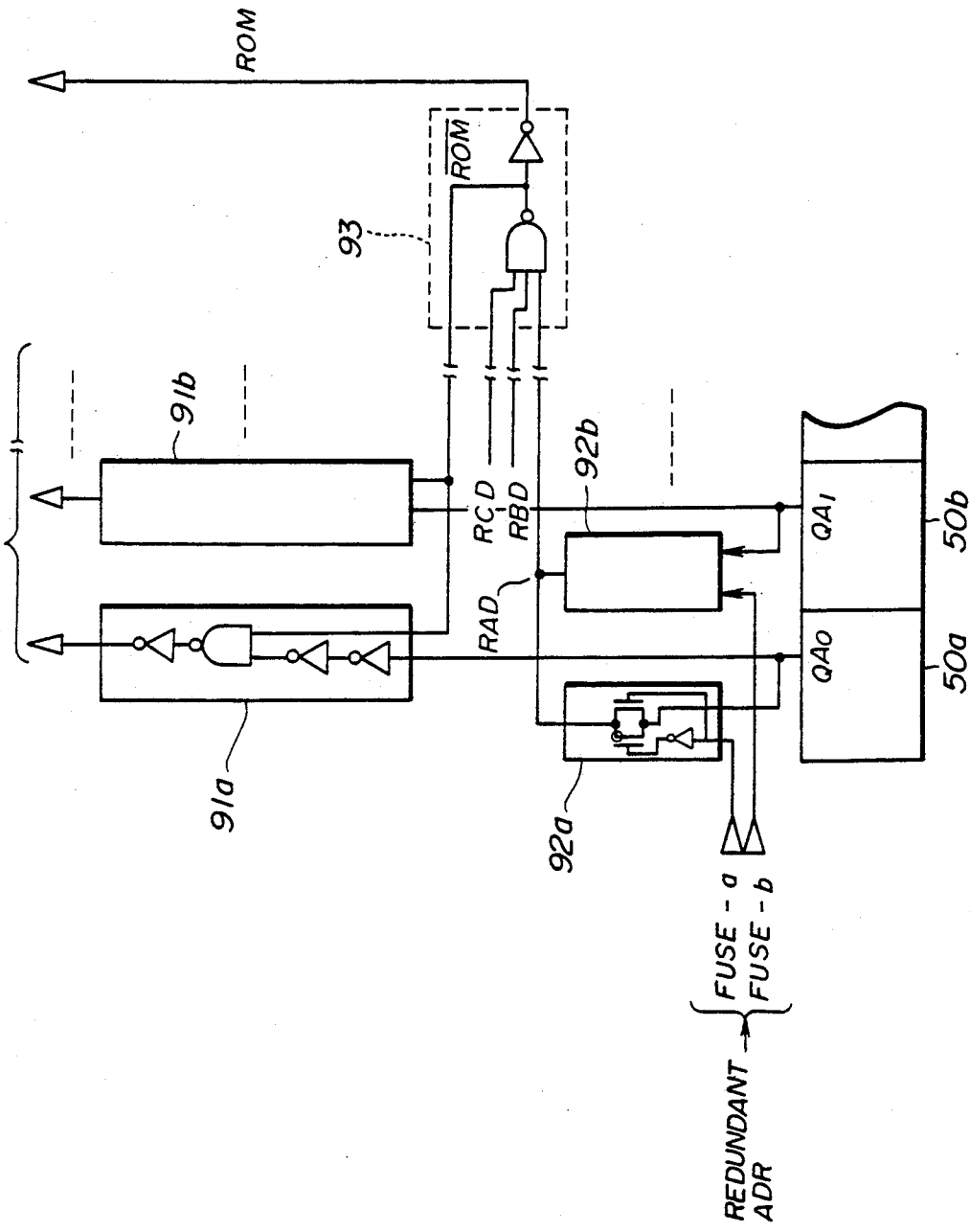
FIG. 12 is a system block diagram showing an essential part of an embodiment of a redundant address switching circuit.
Figure 13:
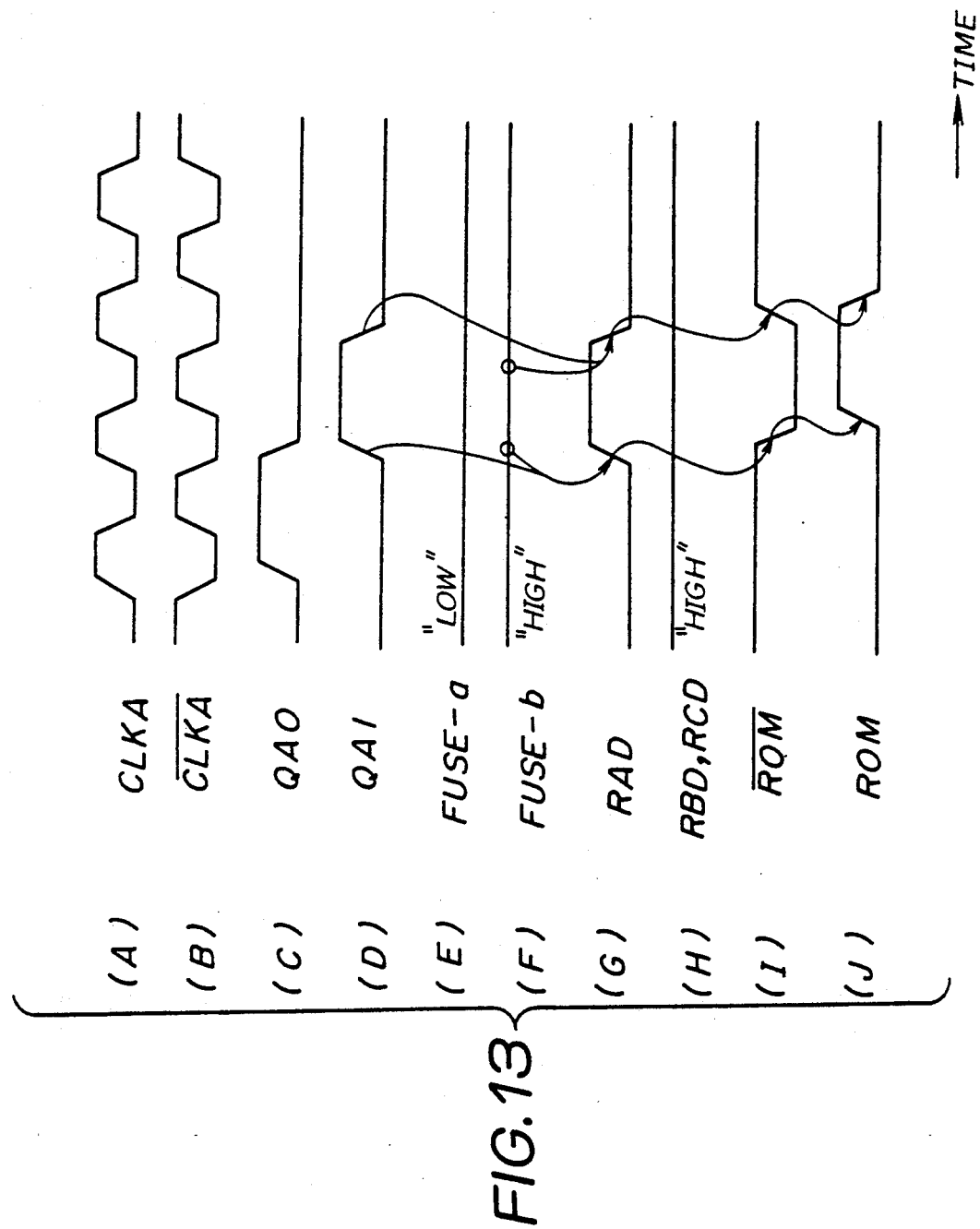
FIGS. 13(A) through 13(J) are timing charts for explaining an operation of the redundant address switching circuit shown in FIG. 12.
Figure 14:
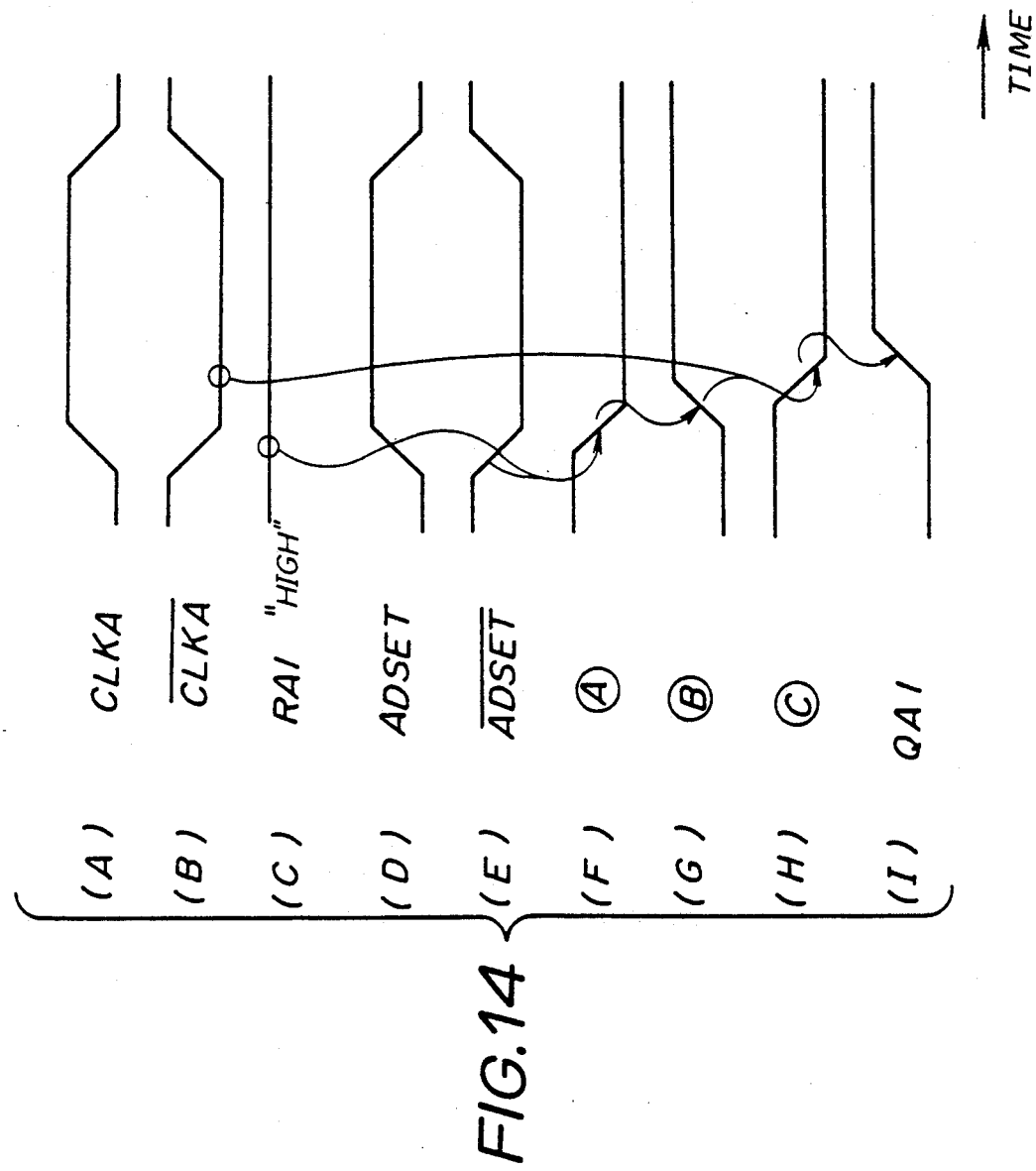
FIGS. 14(A) through 14(I) are timing charts for explaining an operation of the counter shown in FIG. 10 for setting an address.
Figure 15:
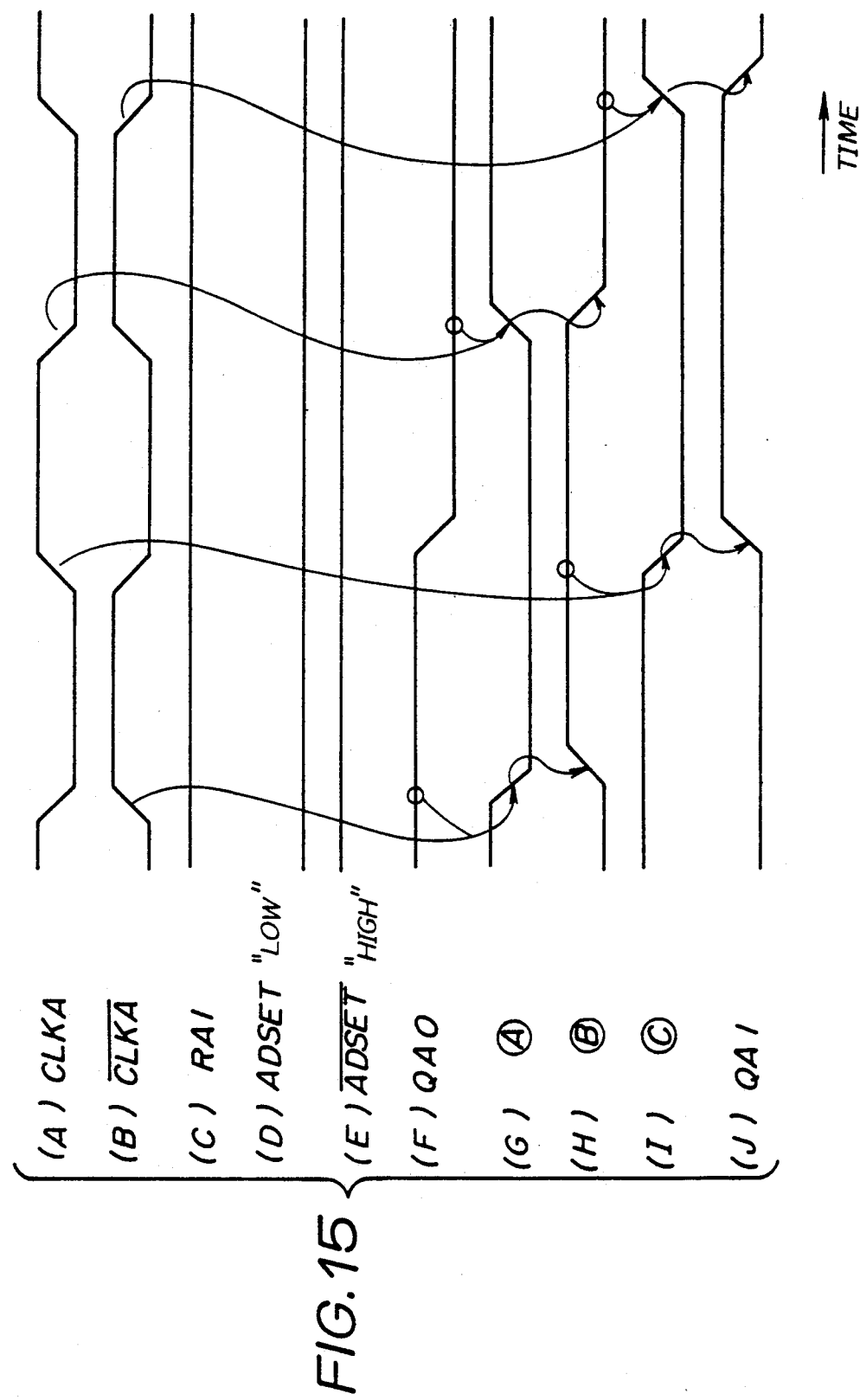
FIGS. 15(A) through 15(J) are timing charts for explaining an operation of the counter shown in FIG. 10 for counting up a set initial address.
Figure 16:
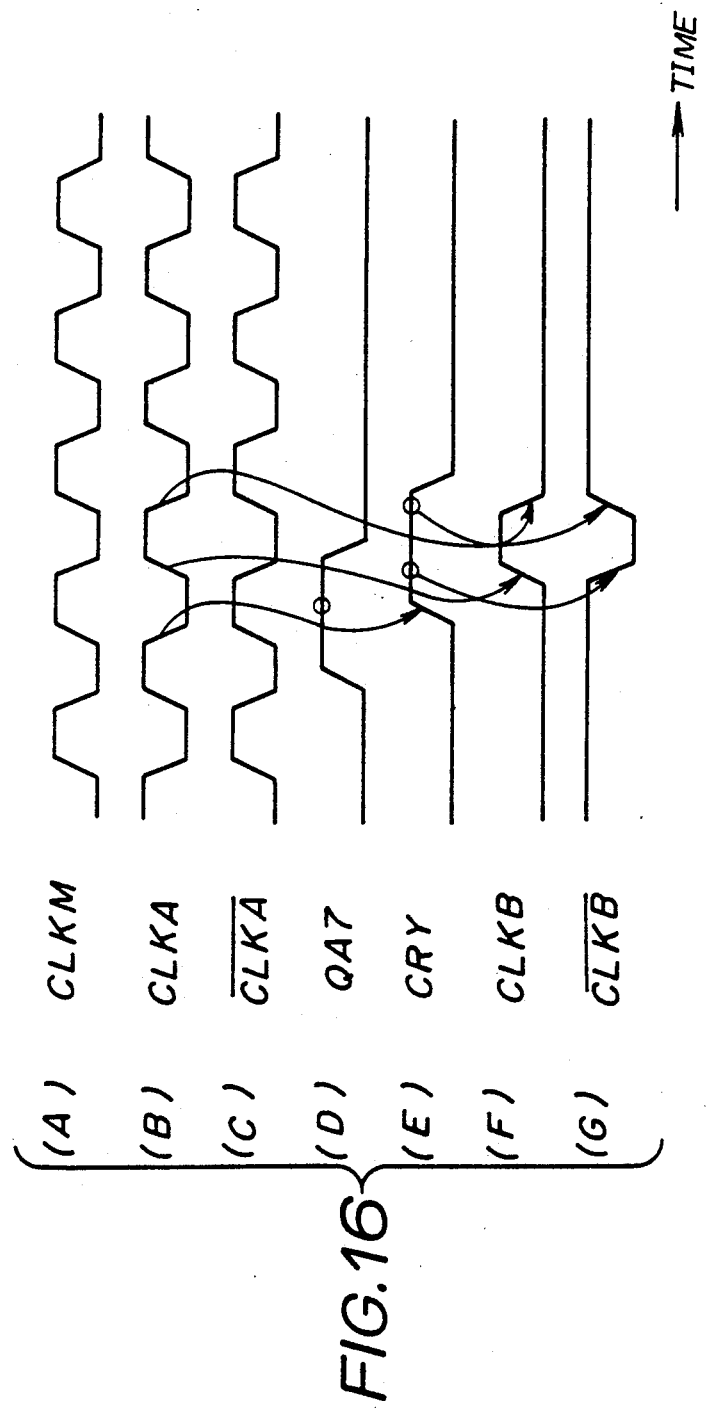
FIGS. 16(A) through 16(G) are timing charts for explaining an operation of a carry generating circuit shown in FIG. 11.
Figure 17:
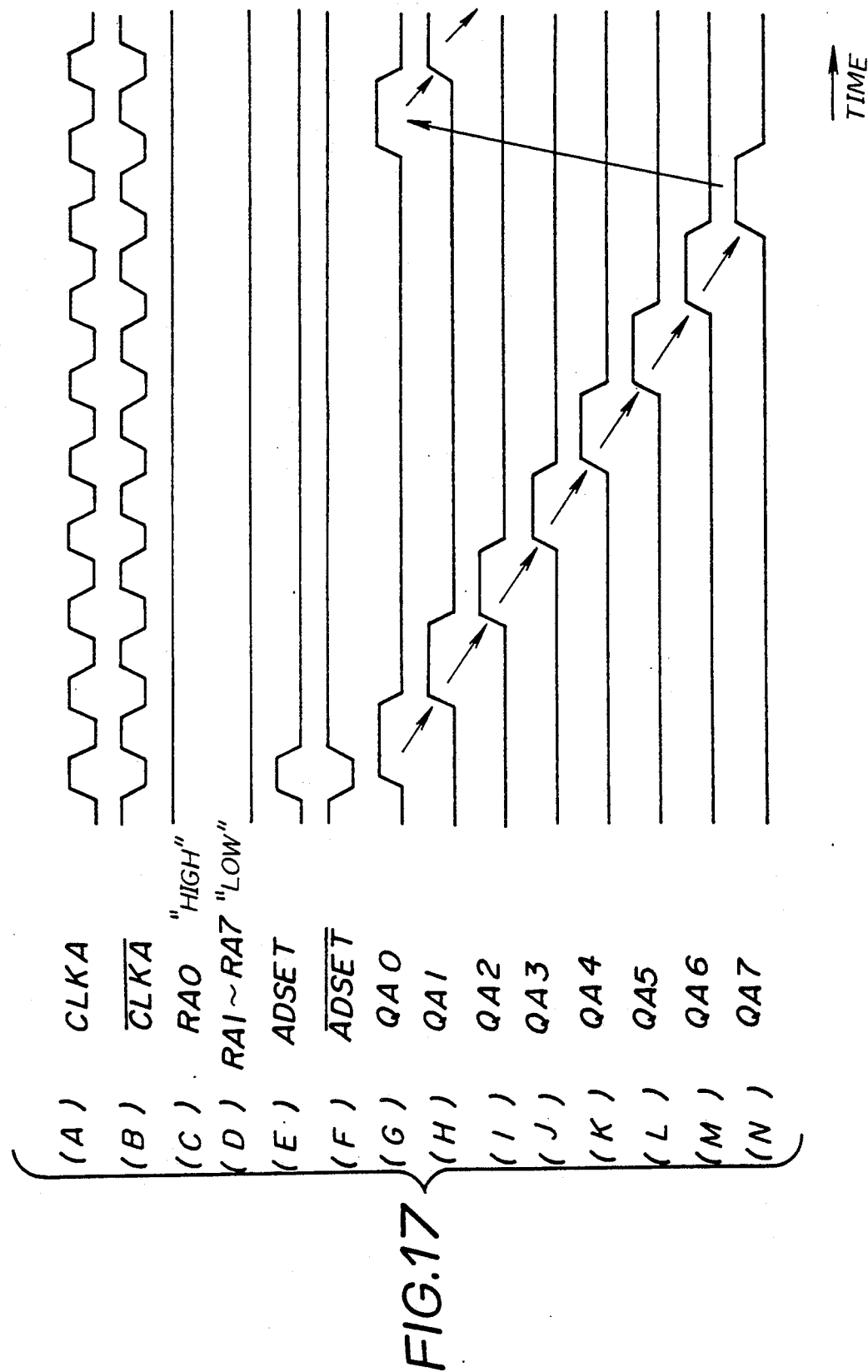
FIGS. 17(A) through 17(N) are timing charts for explaining an operation of a shift register shown in FIG.7.

FIG. 12 shows an essential part of an embodiment of a redundant address switching circuit, and FIGS. 13(A) through 13(J) are timing charts for explaining an operation of the redundant address switching circuit. In FIG. 12, the output data QA0 and QA1 of the counters 50a and 50b are applied to respective address amplifiers 91a and 91b and to respective redundant address transfer gates 92a and 92b. FIGS. 13(A) and 13(B) respectively show the clock signals CLKA and $\overline{CLKA}$, and FIGS. 13(C) and 13(D) respectively show the data QA0 and QA1. When the redundant addresses of the transfer gates 92a and 92b, that is, preprogrammed fuse signals Fuse-a and Fuse-b respectively shown in FIGS. 13(E) and 13(F), have high levels, the data QA0 and QA1 which correspond to the high-level redundant addresses are passed through the respective transfer gates 92a and 92b. The passed data QA0 and QA1 are subjected to a wired OR logic operation at the output side of the transfer gates 92a and 92b. Accordingly, when one of the data QA0 and QA1 (actually, one of the data QA0 through QA7) has a high level, the level of a signal RAD shown in FIG. 13(G) at the output side of the transfer gates of the A-system becomes high.

A NAND gate of a redundant address discriminating circuit 93 carries out a NAND operation on signals RAD, RBD and RCD which are respectively obtained from output sides of the transfer gates of the A-system, B-system and C-system. FIG. 13(H) shows the signals RBD and RCD. An output signal $\overline{ROM}$ of the NAND gate shown in FIG. 13(I) is supplied to the address amplifiers 91a and 91b, and the signals QA0 and QA1 are prohibited from passing through the corresponding address amplifiers 91a and 91b when the signal $\overline{ROM}$ has a low level. The output signal $\overline{ROM}$ of the NAND gate is inverted into a signal ROM shown in FIG. 13(J) in an inverter of the redundant address discriminating circuit 93 and is used as a signal for activating a redundant memory cell (not shown) within one of the memory cell arrays 24a through 24d (or 10).

Because only one bit of the data QA0 through QA7 is "1" in each of the A-system, B-system and C-system, a wired OR logic operation is carried out on the output signals of the transfer gates 92a, 92b and the like in each of the A-system, B-system and C-system. As a result, the signals RAD, RBD and RCD from the A-system, B-system and C-system can be transmitted to the redundant address discriminating circuit 93 by use of three lines.

FIGS. 14(A) through 14(I) are timing charts for explaining the operation of the counter 50b shown in FIG. 10 for setting an address. FIGS. 14(A) and 14(B) respectively show the clock signals CLKA and $\overline{CLKA}$, and FIG. 14(C) shows the datum RA1. When the initial address set signal ADSET shown in FIG. 14(D) changes from a low level to a high level and the initial address set signal $\overline{ADSET}$ shown in FIG. 14(E) changes from a high level to a low level, the datum RAI which has a high level in this case passes through the first gate 64 and appears at a node Ⓐ shown in FIG. 10. The datum RA1 at the node Ⓐ is transferred to a node Ⓑ at the output side of the slave side flip-flop 78. In addition, when the third gate 83 is opened due to the high-level clock signal CLKA and the low-level clock signal $\overline{CLKA}$, the datum RAI appears at a node Ⓒ and is latched by the master side flip-flop 90. FIGS. 14(F), 14(G) and 14(H) respectively show the signals at the nodes Ⓐ, e,crc/B/ and Ⓒ. Such an address setting operation is similarly carried out with respect to the data RA0 and RA2 through RA7, and the initial address of the serial access is set in the counters 50a through 50h of the shift register 50.

FIGS. 15(A) through 15(J) are timing charts for explaining an operation of the counter 50b for counting up the set initial address. FIGS. 15(A) and 15(B) respectively show the clock signals CLKA and $\overline{CLKA}$, and FIG. 15(C) shows the datum RA1. When the initial address set signal ADSET shown in FIG. 15(D) is fixed to the low level and the initial address set signal $\overline{ADSET}$ shown in FIG. 15(E) is fixed to the high level, the datum QA0 shown in FIG. 15(F) from the counter 50a in the previous stage is latched by the slave side flip-flop 78 as the clock signal CLKA changes from the high level to the low level and the clock signal $\overline{CLKA}$ changes from the low level to the high level. FIGS. 15(G), 15(H) and 15(I) respectively show the signal levels at the nodes Ⓐ, Ⓑ and Ⓒ. The datum QA0 is latched by the master side flip-flop 90 as the clock signals CLKA and CLKA undergo transitions of the logic levels and is output as the datum QA1 shown in FIG. 15(J). In other words, the initial address (RA1) is counted up for every period of the clock signals CLKA and $\overline{CLKA}$.

FIGS. 16(A) through 16(G) are timing charts for explaining an operation of the carry generating circuit 50i shown in FIG. 11. FIG. 16(A) shows the master clock signal CLKM, and FIGS. 16(B) and 16(C) respectively show the clock signals CLKA and $\overline{CLKA}$. The carry signal CRY shown in FIG. 16(E) is generated from the carry generating circuit 50i when the level of the datum QA7 shown in FIG. 16(D) which is output from the counter 50h in the final stage becomes high and the next clock signals CLKA and $\overline{CLKA}$ are received. The carry signal CRY is applied to the timing circuit 41 which outputs the clock signals CLKB and $\overline{CLKB}$ respectively shown in FIGS. 16(F) and 16(G) which are synchronized to the clock signals CLKA and $\overline{CLKA}$. As shown in FIGS. 17(G) through 17(N), all the outputs QA0 through QA7 of the counters 50a through 50h are successively shifted by one bit in response to the clock signals CLKA and $\overline{CLKA}$ and this shifting operation is carried out cyclically. FIGS. 17(A) and 17(B) respectively show the clock signals CLKA and $\overline{CLKA}$, FIG. 17(C) shows the datum RA0, FIG. 17(D) shows the data RA1 through RA7, and FIGS. 17(E) and 17(F) respectively show the initial address set signals ADSET and $\overline{ADSET}$. FIGS. 17(A) through 17(N) show the case where only the datum RA0 has the high level, and in this case, the level of the datum QA0 becomes high and the initial address is set at the timing with which the levels of the initial address set signals ADSET and $\overline{\text{ADSET}}$ respectively become high and low. For example, when only the datum RA1 has the high level, the datum QA1 is set as the initial address.

According to this embodiment, the eight counters 50a through 50h are coupled to form the loop and constitute the shift register 50, and the register group is formed by three such shift registers 50 which respectively correspond to the digits $8^0$, $8^1$ and $8^2$ of the octal internal address. In addition, the timing circuit 41 is provided as the shift means 14 which shifts the content of the shift register in the lower significant digit depending on the master clock signal CLKM which is synchronized to the SAS signal corresponding to the predetermined clock signal. This timing circuit 41 also has the function of transferring the carry signal CRY which is received from the lower significant digit of the shift register 50 to the higher significant digit of the shift register 50. Hence, the outputs QA0 through QA7 output from the A-system shift register 50, the outputs QA0 through QA7 output from the B-system shift register 50, and the outputs QA0 through QA7 output from the C-system shift register 50 respectively correspond to the digits of the octal internal address, and are output to the decoder (not shown) as the internal address signal for making access to the serial data registers 29a through 29d. As a result, the following effects are obtainable.

(I) The total number of counters 50a through 50h which constitute the three shift registers 50 is twenty-four ($3 \times n = 3 \times 8 = 24$). The number of registers is greatly reduced compared to the first conventional method described before in conjunction with FIG. 1 where 512 registers are required in the case of the RAM comprising the array of $512 \times 512$ memory cells. For this reason, it is possible to considerably reduce the area the serial access circuits 30a through 30d occupy within the chip. The following Table 1 shows a comparison of this embodiment and the first conventional method in terms of the area.

TABLE 1

|  | Area Occupied by 1 Serial Access Cct. (Arbitrary Unit) | Area Occupied by Entire Chip (Arbitrary Unit) |
| --- | --- | --- |
| 1st Conv. Method | 1.00 | 1.00 |
| 1st Embodiment | 0.55 | 0.86 |

As may be seen from Table 1, the area occupied by the serial access circuit in this embodiment can be reduced to 55% compared to the first conventional method, and the area occupied by the entire chip in this embodiment can be reduced to 86% compared to the first conventional method.

A yield Y can be described by the following formula (1) when an area sensitive to defects is denoted by S and a defect density is denoted by D.

$$Y = e^{-SD} \quad (1)$$

It is readily seen from formula (1) that the yield Y improves exponentially even with a slight reduction in the required chip area, and it is possible to accordingly reduce the production cost. The following Table 2 shows a comparison of this embodiment and the first conventional method in terms of the yield and production cost.

TABLE 2

|  | Yield (Arbitrary Unit) | Production Cost (Arbitrary Unit) |
| --- | --- | --- |
| 1st Conv. Method | 1.00 | 1.00 |
| 1st Embodiment | 1.47 | 0.72 |

(II) Because the address signal obtained from the three shift registers 50 is an octal data signal, it is substantially the same as if the address signal were passed through a predecoder. Accordingly, this embodiment does not require a predecoder exclusively for the access circuit as in the case of the second conventional method described before in conjunction with FIG. 2. As a result, it is possible to reduce the operation time of the circuit by the time corresponding to the operating time of the predecoder and hence improve the operation speed of the circuit as a whole. The following Table 3 shows a comparison of this embodiment and the second conventional method in terms of the access time.

TABLE 3

|  | Access time (Arbitrary Unit) |
| --- | --- |
| 2nd Conv. Method | 1.00 |
| 1st Embodiment | 0.80 |

The predecoder takes up 20% of the access time, and thus, it is possible in this embodiment to reduce the access time to 80% compared to the second conventional method.

In the embodiment described heretofore, n=8 and the 3-digit octal number is taken as an example of the internal address signal. However, n may be set to any number other than two such as n=16, and the number of digits of the internal address signal is not limited to three. Further, the RAM and the SAM are of course not limited to the $512 \times 4$ bit arrangement.

Generally, as the memory capacity of the semiconductor memory increases and the design rule becomes strict, the possibility of defective cells appearing within the produced semiconductor memory becomes large and the yield becomes poor. Hence, in addition to the normal memory cell array, a redundant memory cell array is provided within the chip to avoid the deterioration of the yield by using the redundant memory cell array in place of a portion of the normal memory cell array including defective cells.

A redundant address which indicates a defective cell is preprogrammed within the chip. The preprogramming is made by selectively melting a plurality of redundant fuses.

A conventional semiconductor memory which is preprogrammed of the defective cells in this manner comprises redundant fuses amounting to a number of bits of an external address. For example, eight redundant 35 fuses are provided in the case of a 1-byte external address. The redundant fuses are melted depending on the address of the defective cell. A redundant address (binary datum) which is described by the melted/non-melted state of each fuse is compared with the external address so as to discriminate whether or not the redundant memory cell array is to be used in place of the portion of the normal memory cell array including the defective cells.

But the redundant address used in the conventional semiconductor memory is a binary address. For this reason, when the defective cell is located at the address having a maximum address value, there is a problem in that it is necessary to carry out the troublesome operation of melting all the redundant fuses. On the other hand, as the number of redundant fuses which are melted increases, the probability of the redundant fuses reconnecting due to the so-called growback phenomenon increases. When the growback occurs, the comparison result of the redundant address and the external address becomes in error and there is a problem in that the operation stability of the semiconductor memory become poor.

Next, a description will be given of a second embodiment of the semiconductor memory according to the present invention in which these problems are eliminated, by referring to FIGS. 18 and 19.

Figure 18:
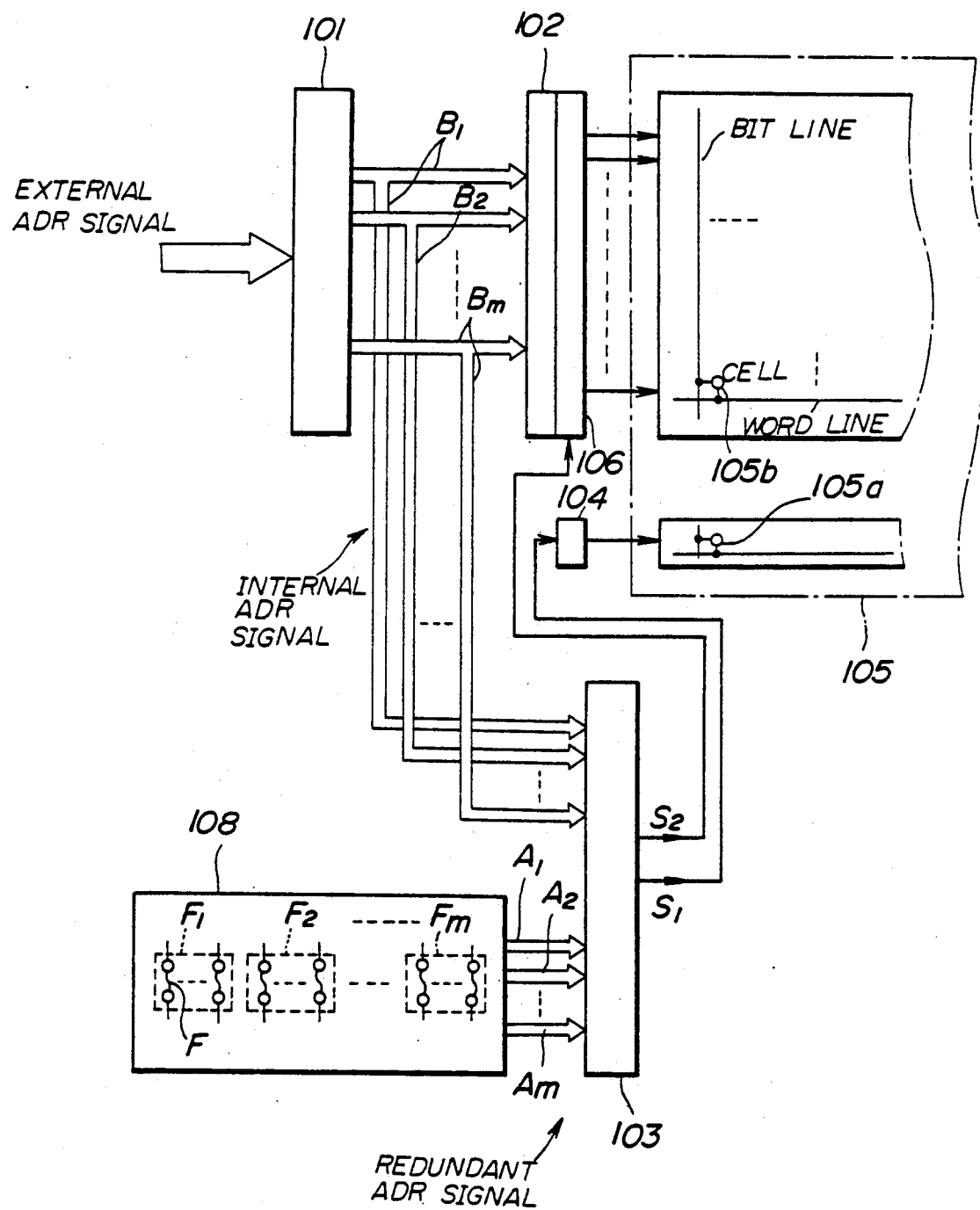
FIG. 18 is a system block diagram showing an essential part of a second embodiment of the semiconductor memory according to the present invention.

In FIG. 18, a predecoder 101 decodes an external address which is described by a binary representation into an n-ary datum (hereinafter referred to as an internal address) which is other than a binary datum. A plurality of address buses $B_1$ through $B_m$ which are grouped for each of the digits $n^0$ through $n^m$ of the n-ary datum are connected on the output side of the predecoder 101. The address buses $B_1$ through $B_m$ are connected to a decoder 102 and a redundancy discriminating circuit 103.

When the n-ary datum is assumed to be an octal number for the sake of convenience, the number of lines in each of the address buses $B_1$ through $B_m$ is eight. In addition, when the external address is an 8-bit binary (1-byte) datum, m=3 and there are three address buses $B_1$ through $B_3$. This is because a maximum number which can be described by the 1-byte datum is $1 \times 2^7 + 1 \times 2^6 ... + 1 \times 2^0 = 255$ and the maximum number 255 can be described satisfactorily by the 3-digit octal datum since $8 \times 8^2 + 8 \times 8^1 + 8 \times 8^0 = 255$.

The redundancy discriminating circuit 3 compares a redundant address and the internal address which is received via the address buses $B_1$ through $B_m$ and outputs redundancy switch signals $S_1$ and $S_2$ when the two addresses coincide. The redundancy switch signal $S_1$ is supplied to a redundant driver 104 which operates responsive thereto and makes active a word line or a bit line which is connected to a redundant memory cell 105a within a memory cell array 105. In addition, the redundancy switch signal $S_2$ is supplied to a normal driver 106 which normally operates depending on a decoded result from the decoder 102 which decodes the internal address. The normal driver 106 makes active one of a plurality of word lines and a bit line which is connected to a normal memory cell 105b within the memory cell array 105, but the normal driver 106 stops this operation of making the word line or bit line active when the redundancy switch signal $S_2$ is received.

A redundant fuse group 108 comprises redundant fuse subgroups $F_1$ through $F_m$ in correspondence with the address buses $B_1$ through $B_m$. A number of redundant fuses F in each of the redundant fuse subgroups $F_1$ through $F_m$ is equal to the number of lines in each of the address buses $B_1$ through $B_m$. In other words, there are eight redundant fuses F in each of the redundant fuse subgroups $F_1$ through $F_m$ when n=8. The state of each redundant fuse F within the redundant fuse group 108, that is, a redundant address which is described by the melted/non-melted state of each redundant fuse F, is supplied to the redundancy discriminating circuit 103 via redundant address buses $A_1$ through $A_m$. The number of redundant address buses $A_1$ through $A_m$ and the number of lines in each of the redundant address buses $A_1$ through $A_m$ are identical to those of the address buses $B_1$ through $B_m$.

Figure 19:
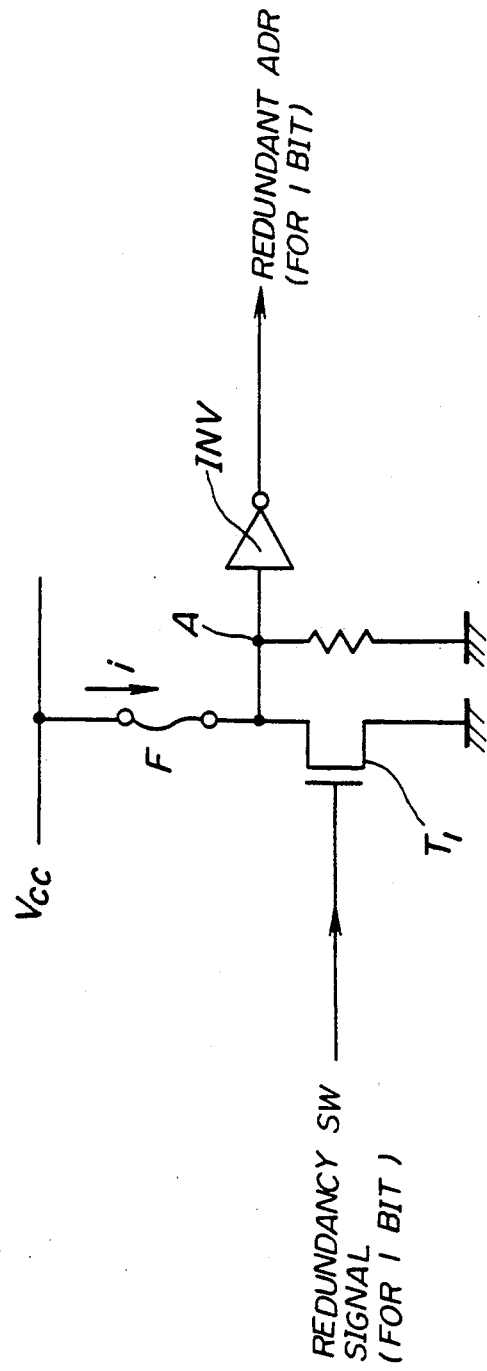
FIG. 19 is a circuit diagram showing an embodiment of a fuse circuit.

FIG. 19 shows an embodiment of a fuse circuit within the redundant fuse group 108 for one bit. In this fuse circuit, a cutting signal which is generated from the external address is applied to a transistor $T_1$ and turns this transistor $T_1$ ON so as to flow a cutting current i to the redundant fuse F. The redundant fuse F is melted and cut when the cutting current i flows therethrough. When the redundant fuse F is melted and cut, a signal level at a node A becomes low. But on the other hand, the signal level at the node A becomes high (that is, a power source voltage Vcc) when the redundant fuse F is not melted. The datum "high" or "low" which is programmed depending on the state of the redundant fuse F is passed through an inverter INV and is output as one bit of the redundant address.

For example, when the external address is "$11111111_2$" (where the subscript "2" indicates a binary number), the predecoder 101 converts this external address into the internal address "$377_8$" (where the subscript "8" indicates the octal number). In other words, "$377_8$"=$3 \times 8^2 + 7 \times 8^1 + 7 \times i^0$, and the internal address which is grouped by the three digits ($8^0$, $8^1$ and $8^2$) is decoded in the decoder 102. One word line or one bit line which is connected to the normal memory cell 105b is selected depending on the decoded result from the decoder 102.

When a defective memory cell is connected to the selected word line or bit line, the address of this defective memory cell is preprogrammed as the redundant address. This preprogramming is carried out as follows. That is, in the case where the internal address of the defective memory cell is "$377_8$", one redundant fuse F of the redundant fuse subgroup $F_1$ corresponding to the most significant digit "3" of "$377_8$" is melted, one redundant fuse F of the redundant fuse subgroup $F_2$ corresponding to the next most significant digit "7" of "$377_8$" is melted, and one redundant fuse F of the redundant fuse subgroup $F_3$ corresponding to the least significant digit "7" of "$377_8$" is melted. The redundant address which is supplied to the redundancy discriminating circuit 103 via the redundant address buses $A_1$ through $A_m$ becomes "$377_8$" which is identical to the above mentioned internal address, and it is thus possible to detect the address coincidence in the redundancy discriminating circuit 103. As a result, the redundancy switch signals $S_1$ and $S_2$ are output from the redundancy discriminating circuit 103 and the redundant memory cell 105a is selected in place of the defective memory cell.

According to this embodiment, the redundant address is generated in correspondence with the internal address which is converted from the binary datum into the n-ary datum in the predecoder 101. For this reason, the number of redundant fuses F which needs to be melted and cut is reduced to the number of digits of the n-ary datum, thereby making it possible to simplify the operation of melting and cutting the redundant fuses and also improve the operation efficiency. In addition, the frequency of the growback phenomenon is considerably reduced due to the reduced number of redundant fuses F which needs to be melted and cut, and it is hence possible to improve the operation stability of the memory.

The concept of this second embodiment is similarly applicable to a semiconductor memory which is provided with a serial access memory, including the type of semiconductor memory described as the first embodiment.

Next, a description will be given of a third embodiment of the semiconductor memory according to the present invention, by referring to FIGS. 20 and 21.

Figure 20:
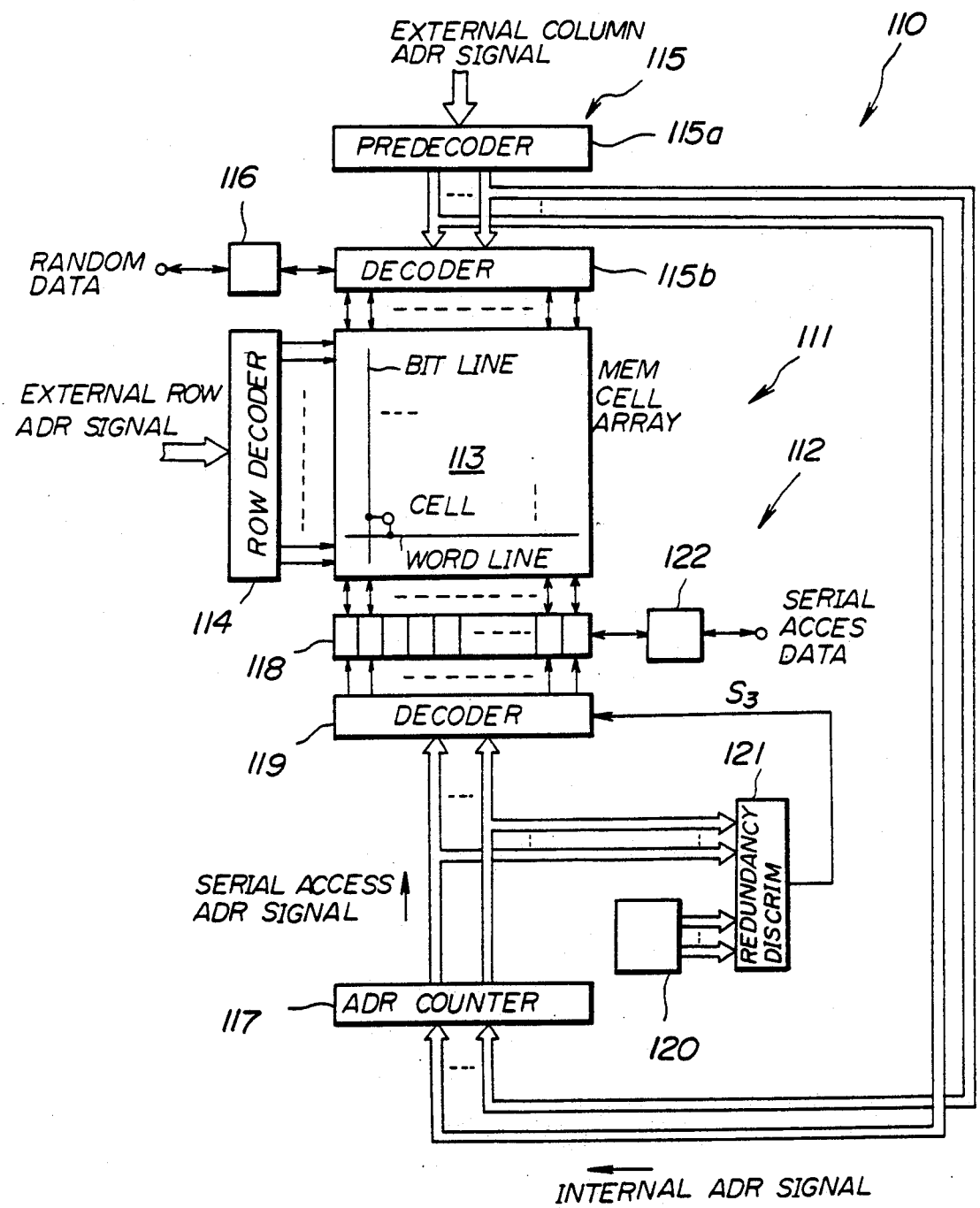
FIG. 20 is a system block diagram showing an essential part of a third embodiment of the semiconductor memory according to the present invention.

In FIG. 20, a semiconductor memory 110 comprises a RAM 111 and a SAM 112 The RAM 111 includes a memory cell array 113, a row decoder 114, a column decoder 115, and an input/output buffer 116. The row decoder 114 decodes an external row address signal and selects one word line in the memory cell array 113. The column decoder 115 decodes an external column address signal and selects one bit line in the memory cell array 113 and also write and reads random data to and from the memory cell array 113 via the selected bit line. The column decoder 115 includes a predecoder 115a for converting the external column address signal which is a binary datum into an internal address signal which is an n-ary datum, and a decoder 15b for decoding the internal address signal. The random data is input and output to and from the RAM 11 via the input/output buffer 116.

On the other hand, the SAM 112 includes an address counter 117, a serial data register 118, a decoder 119, a redundant address generating circuit 120, a redundancy discriminating circuit 121, and an input/output buffer 122. The address counter 117 enters the internal address signal from the predecoder 115a when needed to set an initial value and generates a serial access address by successively counting up from the initial value. The decoder 119 decodes the serial access address which is received from the address counter 117 and successively makes access to each cell of the data register 118, or makes access to the redundant memory cells when a redundancy switch signal $S_3$ is received. The data register 118 comprises a number of register cells amounting to one word of the memory cell array 113, and at least one register cell of the data register 118 is used as a redundant cell. The redundancy discriminating circuit 121 compares the serial address which is generated by the address counter 117 and the redundant address which is generated by the redundant address generating circuit 120 and outputs the redundancy switch signal $S_3$ when the two addresses coincide. The serial data is input and output to and from the SAM 12 via the input/output buffer 122.

Figure 21:
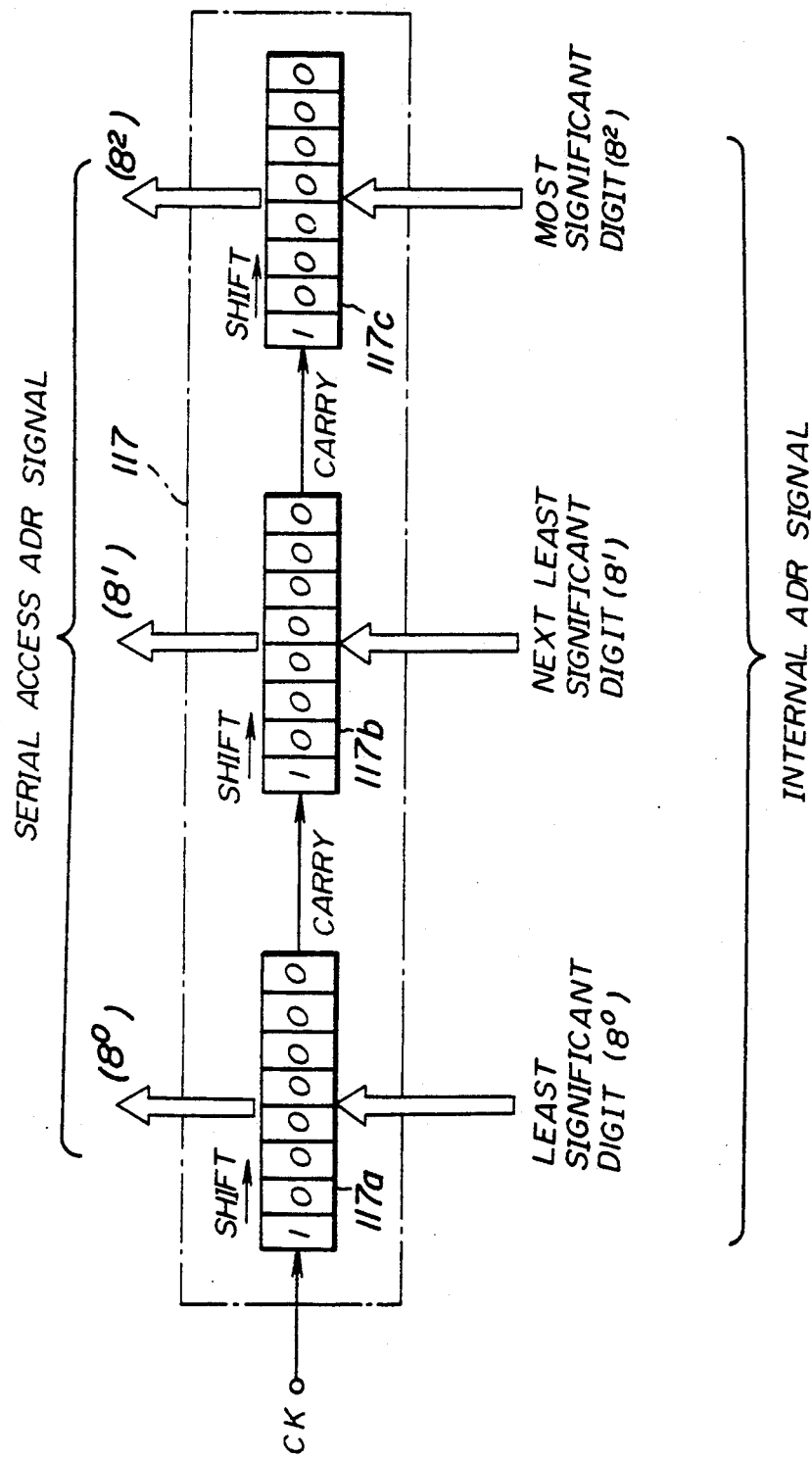
FIG. 21 is a diagram for explaining an embodiment of an address counter shown in FIG. 20.

FIG. 21 shows an embodiment of the address counter 117. For the sake of convenience, the n-ary datum is assumed to be a 3-digit octal datum. The address counter 117 comprises three shift registers 117a, 117b and 117c. The shift register 117a corresponds to the least significant digit ($8^0$) of the internal address, the shift register 117b corresponds to the next least significant digit ($8^1$) of the internal address, and the shift register 117c corresponds to the most least significant digit ($8^2$) of the internal address. The contents of the shift registers 117a, 117b and 117c respectively have only one "1" set therein, and an initial position of the set "1" is determined by the internal address signal.

The content of the shift register 117a is successively shifted to the right in FIG. 21 responsive to a clock signal CK, and the shifting operation is repeated cyclically. In addition, the shift registers 117b and 117c respectively carry out a shifting operation in response to a carry signal which is received from the shift register which is in the preceding stage and corresponds to a lower significant digit. In other words, after the contents of the shift registers 117a, 117b and 117c are set depending on the internal address signal, the shift registers 117a, 117b and 117c generates a 3-digit serial access address signal ($8^0$, $8^1$ and $8^2$) which successively counts up responsive to the clock signal CK. Accordingly, the serial access address signal also becomes an octal datum similarly to the internal address signal. When the redundant address is programmed in octal number in correspondence with the serial access address signal, it is possible to reduce the number of redundant fuses which needs to be melted and cut similarly to the second embodiment. That is, the redundant address generating circuit 120 of this embodiment employs basically the same concept as the redundant fuse group 108 of the second embodiment.

Further, the present invention is not limited to these embodiments, but various variations and modifications may be made without departing from the scope of the present invention.

What is claimed is:

1. A semiconductor memory which outputs data serially, said semiconductor memory comprising:
    a serial data register for storing a plurality of bits of data;
    a first shift register having a plurality of first registers with input and output ends thereof which are coupled in a loop, said first shift register shifting a content among said plurality of first registers in response to a clock signal;
    a second shift register having a plurality of second registers with input and output ends thereof which are coupled in a loop, said second shift register shifting a content among said plurality of second registers in response to a shift clock signal which is obtained from a most significant bit from one of said plurality of first registers of said first shift register; and a decoder which receives as an internal address a plurality of bits of data within said first and second shift registers, said decoder being coupled to a serial data register and designating a bit to be output out of he plurality of bits based on the internal address.

2. The semiconductor memory as claimed in claim 1, which further comprises:
    a third shift register which has a plurality of third registers with input and output ends thereof which are coupled in a loop, said third shift register shifting a content among said plurality of third registers in response to a shift clock signal which is obtained from a most significant bit from one of said second registers, said decoder receiving as an internal address a plurality of bits of data within said first, second and third shift registers and designating a bit to be output out of the plurality of bits based on the internal address.

3. The semiconductor memory as claimed in claim 1 which further comprises a plurality of third shift registers each having input and output ends thereof which are coupled, each of said third shift registers shifting a content thereof in response to a shift clock signal which is obtained from a most significant bit of a shift register in a preceding stage, said decoder receiving as an internal address a plurality of bits of data within said first, second and third shift registers and designating a bit to be output out of the plurality of bits based on the internal address.

4. The semiconductor memory as claimed in claim 1 wherein said first and second shift registers are set with an initial value which is obtained by decoding an external binary address.

5. A semiconductor memory which outputs data serially, said semiconductor memory comprising:
- a serial data register for storing a plurality of bits of data;
- a first shift register having a plurality of first registers with input and output ends thereof which are coupled in a loop, said first shift register shifting a content among the plurality of first registers in response to a clock signal;
- a second shift register having a plurality of second registers with input and output ends thereof which are coupled in a loop, said second shift register shifting a content among said plurality of second registers in response to a shift clock signal which is obtained from a most significant bit from one of the plurality of first registers of said first shift register;
- a decoder which receives as an internal address a plurality of bits of data within said first and second shift registers, said decoder being coupled to a serial data register and designating a bit to be output out of the plurality of bits based on the internal address;
- a random access memory cell array coupled to said serial data register;
- a row decoder which decodes a row address for making access to said random access memory cell array; and
- a column decoder which decodes a column address for making access to said random access memory cell array, said column decoder including a first column decoder for predecoding the column address and a second column decoder for decoding an output of said first column decoder, the output of said first column decoder being set in said first and second shift registers as an initial value.

6. A semiconductor memory which outputs data serially, said semiconductor memory comprising:
- a serial data register for storing $s^M$ bits of data, where $M>3$;
- N shift registers each having input and output ends thereof which are coupled in a loop, where $N>1$, each of said N shift registers storing $2^{M/N}$ bits of data, one of said N shift registers shifting a content thereof internally among $2^{M/N}$ bit registers of the one of said N shift registers in response to a clock signal, remaining N−1 shift registers each shifting a content thereon internally among $2^{M/N}$ bit registers of each of the remaining N−1 shift registers in response to a shift clock signal which is obtained from a most significant bit of a shift register in a preceding stage; and
- a decoder which receives as an internal address a plurality of bits of data within said N shift register, said decoder being coupled to said serial data register and designating a bit to be output out of the plurality of bits based on the internal address.

7. The semiconductor memory as claimed in claim 6 wherein each of said N shift registers are set with an initial value which is obtained by decoding an external M/N-bit binary address.

8. A semiconductor memory comprising:
- a memory cell array which includes a plurality of memory cells respectively connected to one of a plurality of word lines and to one of a plurality of bit lines;
- a serial data register which includes a number of bit cells corresponding to one word of said memory cell array;
- first decoder means for decoding an address signal and for successively making an access to each bit cell of said serial data register based on a decoded result;
- a register group comprising m+1 shift registers in correspondence with each digit of the address signal, each of said shift registers comprising n registers which are connected to form a loop, where m and n are integers satisfying $m \geq 0$ and $n>2$;
- shift means for shifting a content of one of said shift registers corresponding to a least significant digit of the address signal in response to a clock signal; and
- transfer means for transferring a carry information which is received from a first arbitrary one of said shift registers to a second arbitrary one of said shift registers, said first arbitrary shift register corresponding to an with most significant digit of the address signal, said second arbitrary shift register corresponding to a (i+1)th most significant digit of the address signal,
- output signals of said shift registers being used as said address signal.

9. The semiconductor memory as claimed in claim 8 wherein said register group outputs an (m+1)-digit n-ary signal as said address signal, each of said shift registers outputting a corresponding one of m+1 digits of the n-ary signal, where the m+1 digits are $n^0, n^1, \ldots, n^m$.

10. The semiconductor memory as claimed in claim 9 wherein m=2 and n=8.

11. The semiconductor memory as claimed in claim 8 wherein said registers comprise n counters for counting the clock signal, a jth counter receiving an output of a (j−1)th counter and outputting an output thereof to a (j+1)th counter, where j=2, 3, ..., n−1, an nth counter receiving an output of a (n−1)th counter and outputting an output thereof to a first counter.

12. The semiconductor memory as claimed in claim 8 which further comprises second decoder means for decoding an external address and for making access to a predetermined memory cell within said memory cell array based on a decoded result.

13. The semiconductor memory as claimed in claim 12 which further comprises first input/output means coupled to said second decoder means for inputting and outputting random data to and from said memory cell array, and second input/output means coupled to said serial data register for inputting and outputting serial data to and from said serial data register.

14. The semiconductor memory as claimed in claim 8 which further comprises a redundant address switching circuit for activating a redundant memory cell within said memory cell array based on a redundant address signal.

15. The semiconductor memory as claimed in claim 14 wherein said redundant address switching circuit comprises a redundant address discriminating circuit for supplying to said first decoder means a signal for activating the redundant memory cell based on the redundant address signal and the output signals of each of said shift registers.

16. The semiconductor memory as claimed in claim 8 which further comprises redundant address generating means for generating a redundant address signal and a redundancy discriminating circuit for supplying to said first decoder means a redundancy switch signal for activating a redundant memory cell within said memory cell array when the address signal coincides with the redundant address signal, said redundant address generating means including redundant fuses which are selectively melted and cut depending on the redundant address signal which is to be generated.

17. The semiconductor memory as claimed in claim 16 wherein the redundant fuses of said redundant address generating means are grouped for each output signal of said register group.

18. The semiconductor memory as claimed in claim 17 wherein a number of groups of the redundant fuses is $m+1$ and a number of the redundant fuses within each group is n.

19. The semiconductor memory as claimed in claim 18 wherein said register group outputs an $(m+1)$-digit n-ary signal as said address signal, each of said shift registers outputting a corresponding one of $m+1$ digits of the n-ary signal, where the $m+1$ digits are $n^0, n^1, ..., n^m$, said redundant address generating means outputting an $(m+1)$-digit n-ary signal as said redundant address signal.

20. The semiconductor memory as claimed in claim 19 wherein $m=2$ and $n=8$.

* * * * *